(12) United States Patent
Masuoka et al.

(10) Patent No.: US 9,893,179 B2
(45) Date of Patent: Feb. 13, 2018

(54) METHOD FOR PRODUCING SEMICONDUCTOR DEVICE AND SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/191,712

(22) Filed: Jun. 24, 2016

(65) Prior Publication Data
US 2016/0308046 A1 Oct. 20, 2016

Related U.S. Application Data

(63) Continuation of application No. PCT/JP2014/055668, filed on Mar. 5, 2014.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/0273* (2013.01); *H01L 21/31055* (2013.01);
(Continued)

(58) Field of Classification Search
None
See application file for complete search history.

(56) References Cited

U.S. PATENT DOCUMENTS

| 5,258,635 A | 11/1993 | Nitayama et al. |
| 6,891,234 B1 | 5/2005 | Connelly et al. |
| (Continued) | | |

FOREIGN PATENT DOCUMENTS

| JP | 02071556 A | 3/1990 |
| JP | 02188966 A | 7/1990 |
| (Continued) | | |

OTHER PUBLICATIONS

C.C. Wu, et al., "High Performance 22/20nm FinFET SMOS Devices with Advanced High-K/Metal Gate Scheme", 2010 IEEE International Electron Devices Meeting (IEDM), 2010, pp. 27.1.1-27.1.4, San Francisco, CA.
(Continued)

*Primary Examiner* — Long Pham
(74) *Attorney, Agent, or Firm* — Brinks Gilson & Lione

(57) ABSTRACT

A method for producing a semiconductor device includes a first step of forming a first insulating film around a fin-shaped semiconductor layer on a semiconductor substrate; a second step of forming a pillar-shaped semiconductor layer, a first dummy gate, and a first hard mask; a third step of forming a second hard mask, forming a second dummy gate, and forming a first dummy contact; a fourth step of forming a sidewall and forming a metal-semiconductor compound in an upper portion of a second diffusion layer; a fifth step of forming a gate electrode, a gate line, and a first contact; and a sixth step of forming a second contact, a third contact made of a second metal, and a fourth contact made of the second metal.

6 Claims, 46 Drawing Sheets

(51) Int. Cl.

| | | |
|---|---|---|
| *H01L 21/027* | (2006.01) | |
| *H01L 21/3105* | (2006.01) | |
| *H01L 21/3205* | (2006.01) | |
| *H01L 21/321* | (2006.01) | |
| *H01L 21/3213* | (2006.01) | |
| *H01L 21/8234* | (2006.01) | |
| *H01L 23/528* | (2006.01) | |
| *H01L 27/088* | (2006.01) | |
| *H01L 21/768* | (2006.01) | |

(52) U.S. Cl.
CPC .. *H01L 21/32055* (2013.01); *H01L 21/32115* (2013.01); *H01L 21/32133* (2013.01); *H01L 21/76897* (2013.01); *H01L 21/823437* (2013.01); *H01L 21/823475* (2013.01); *H01L 21/823487* (2013.01); *H01L 23/528* (2013.01); *H01L 27/088* (2013.01); *H01L 29/66545* (2013.01); *H01L 29/66666* (2013.01)

(56) References Cited

U.S. PATENT DOCUMENTS

| | | | |
|---|---|---|---|
| 8,563,379 | B2 | 10/2013 | Masuoka et al. |
| 8,647,947 | B2 * | 2/2014 | Masuoka ........ H01L 21/823885 257/329 |
| 2004/0262681 | A1 | 12/2004 | Masuoka et al. |
| 2009/0065860 | A1 | 3/2009 | Mikasa |

FOREIGN PATENT DOCUMENTS

| | | |
|---|---|---|
| JP | 03145761 A | 6/1991 |
| JP | 11297984 A | 10/1999 |
| JP | 2004356314 A | 12/2004 |
| JP | 2009070975 A | 4/2009 |
| JP | 2009182317 A | 8/2009 |
| JP | 2011040682 A | 2/2011 |
| JP | 2013239622 A | 11/2013 |
| WO | 2014024266 A1 | 2/2014 |

OTHER PUBLICATIONS

K. Mistry, et al., "A 45nm Logic Technology with Kigh-k+Metal Gate Transistors, Strained Silicon, 9 Cu Interconnect Layers, 193nm Dry Patterning, and 100% Pb-free Packaging", 2007 IEEE International Electron Devices Meeting, 2007, pp. 247-250, Washington, DC, URL: ftp://download.intel.com/pressroom/kits/advancedtech/pdfs/Mistry_IEDM_2007_HiK-MG_paper.pdf.

English language translation of International Preliminary Report on Patentability in corresponding International Application No. PCT/JP2014/055668, dated Sep. 15, 2016, 6 pages.

* cited by examiner

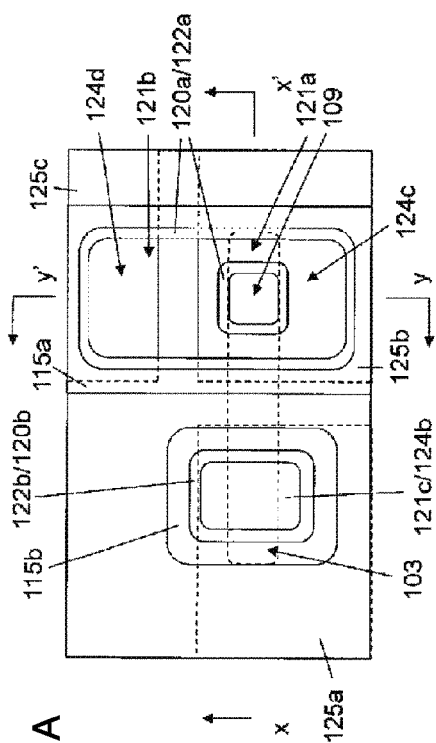
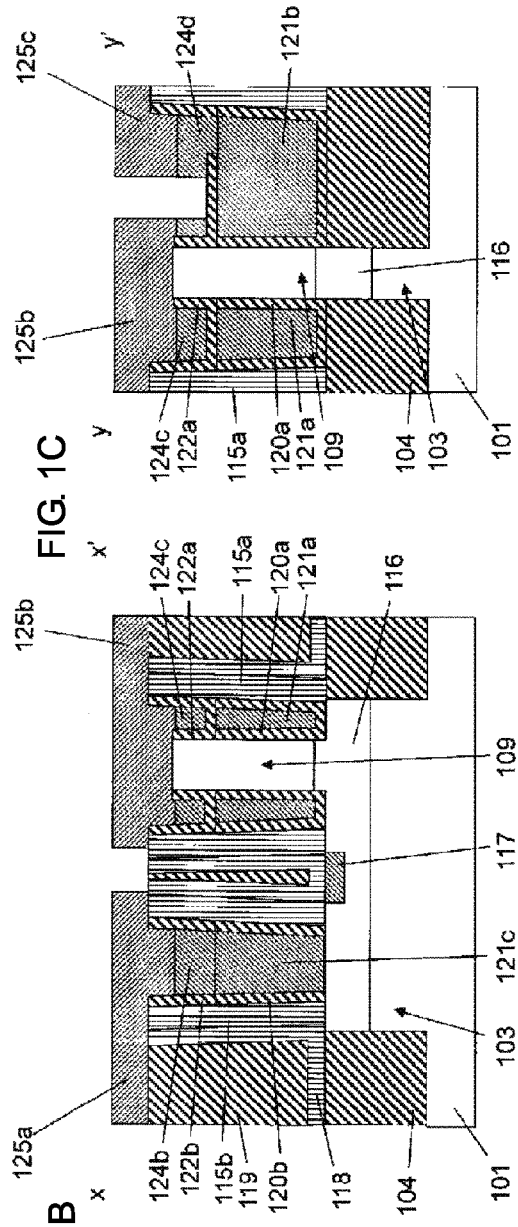

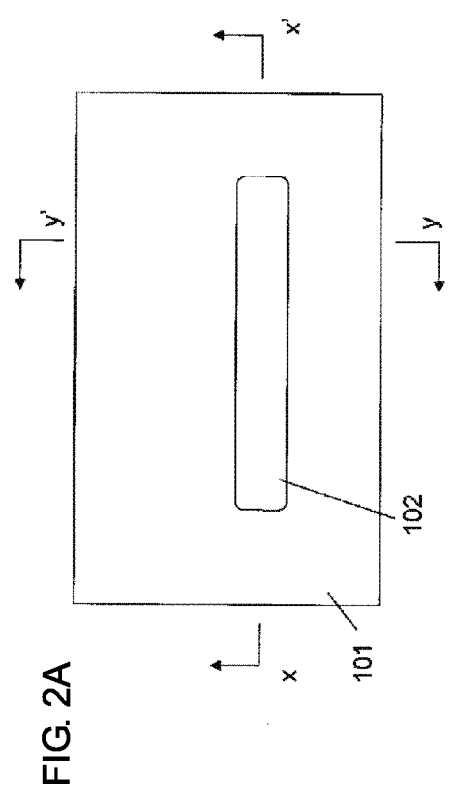
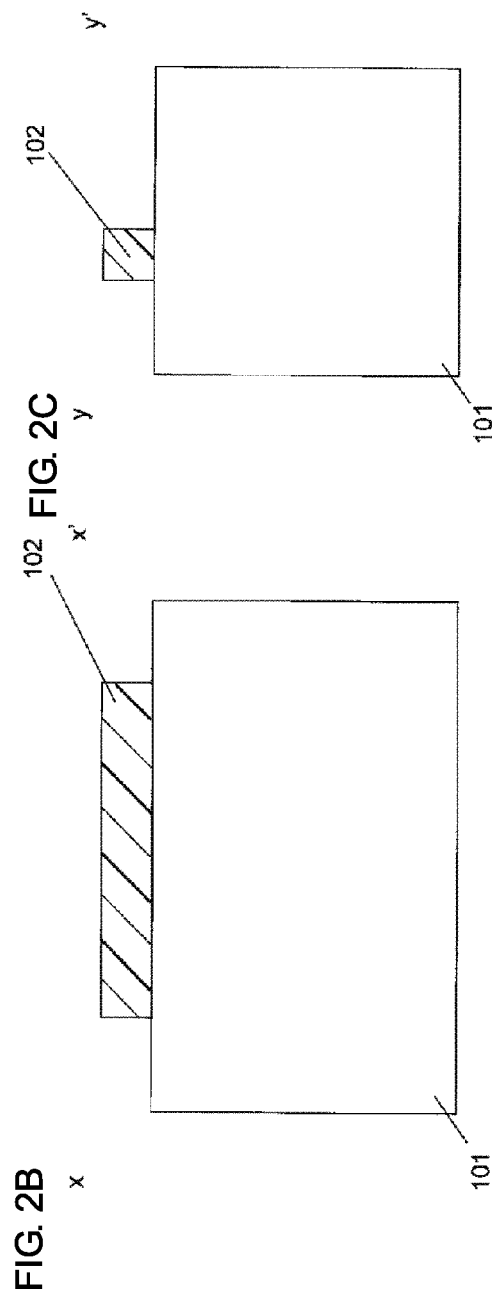
FIG. 2A
FIG. 2B
FIG. 2C

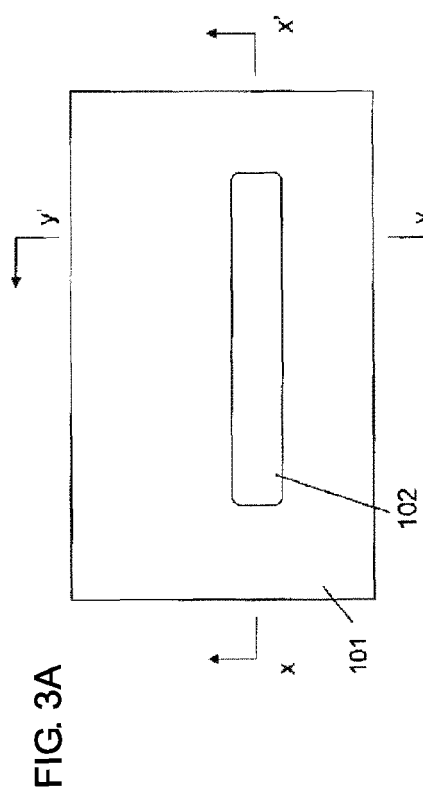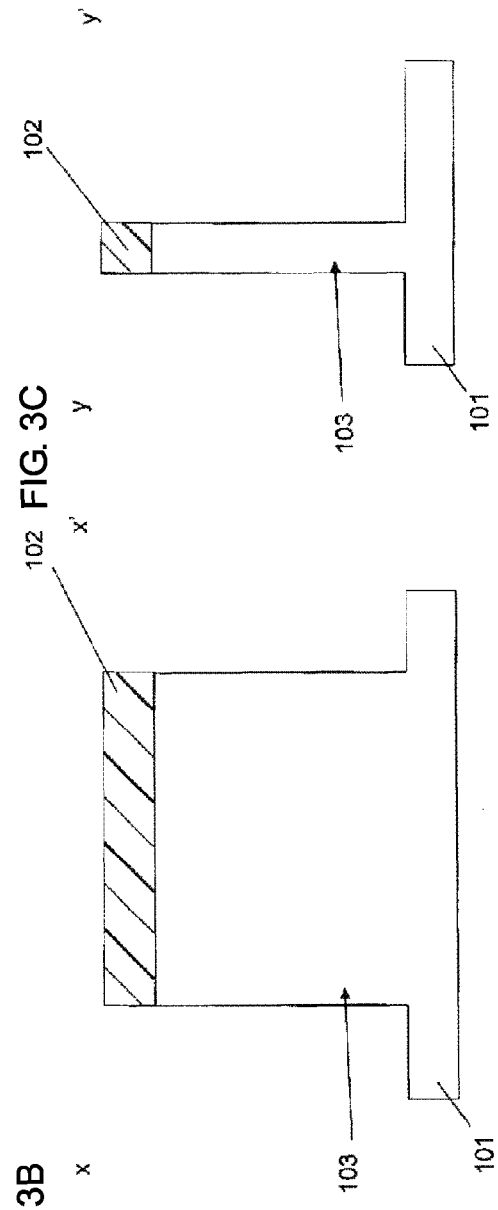

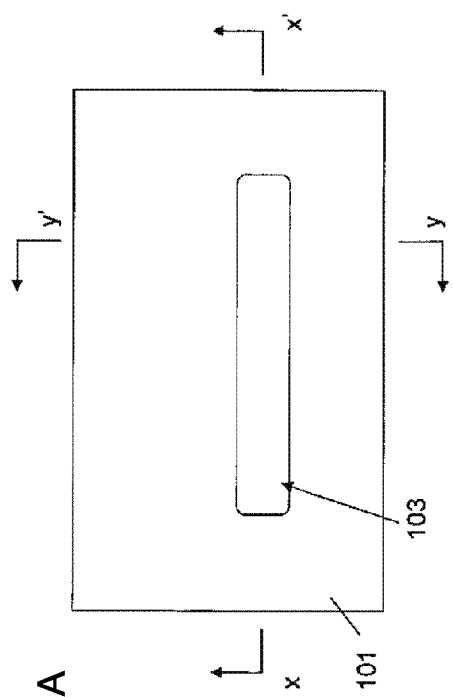
FIG. 4A
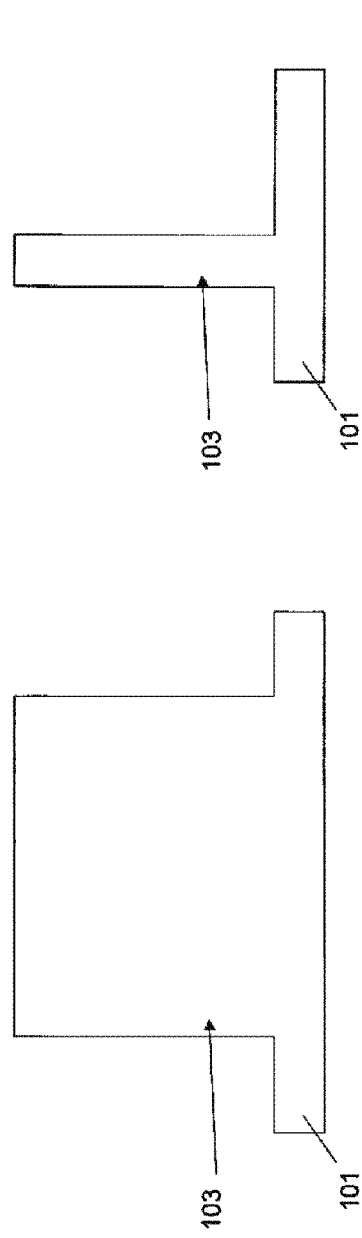
FIG. 4C
FIG. 4B

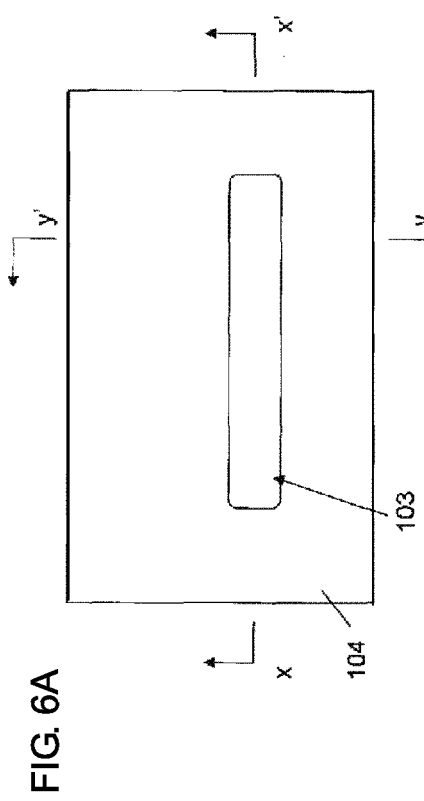
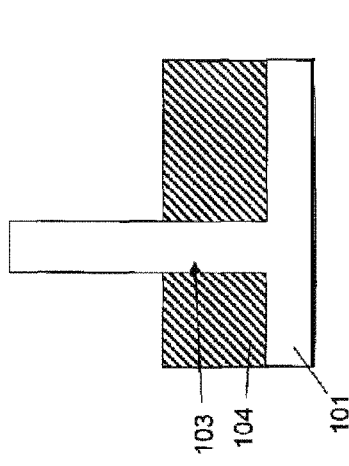
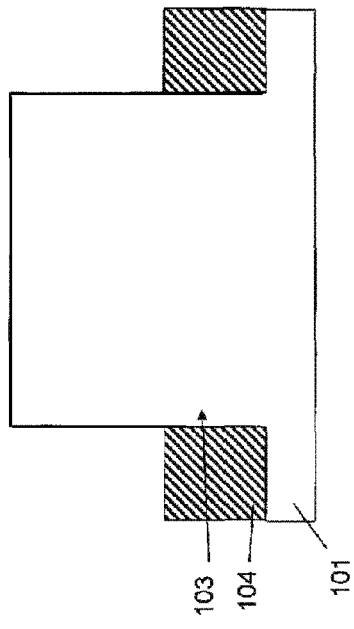
FIG. 6A
FIG. 6B
FIG. 6C

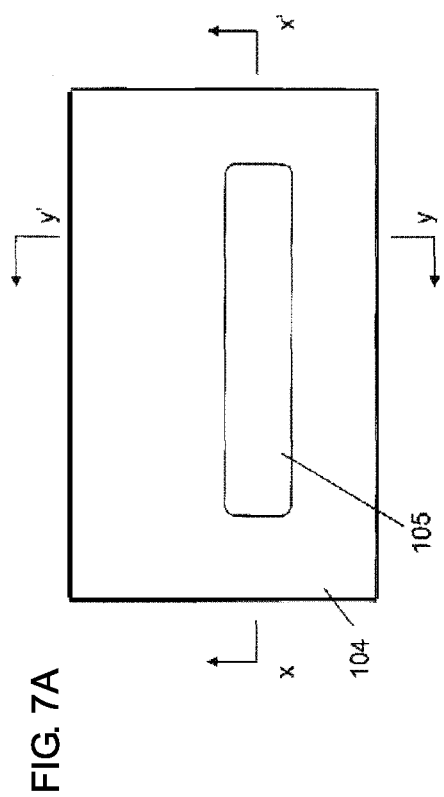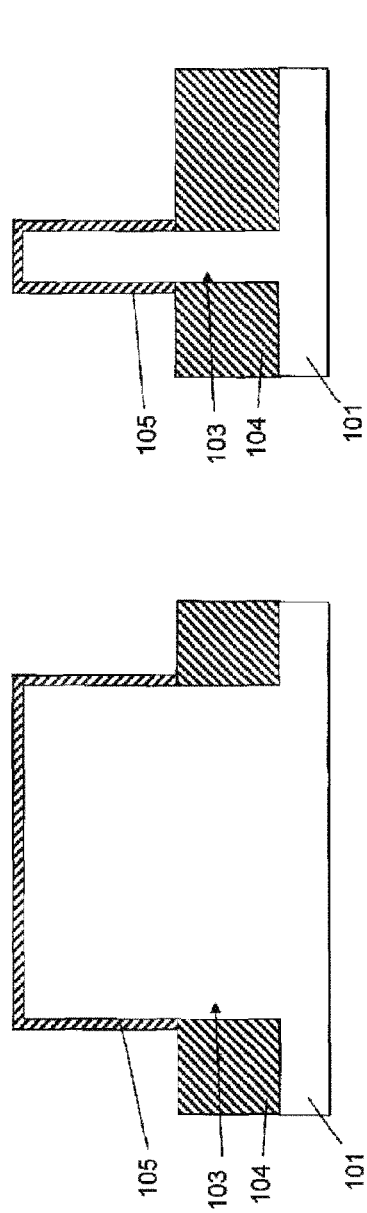

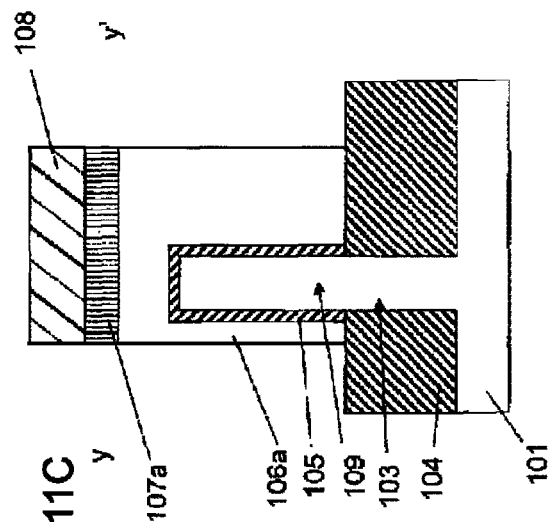
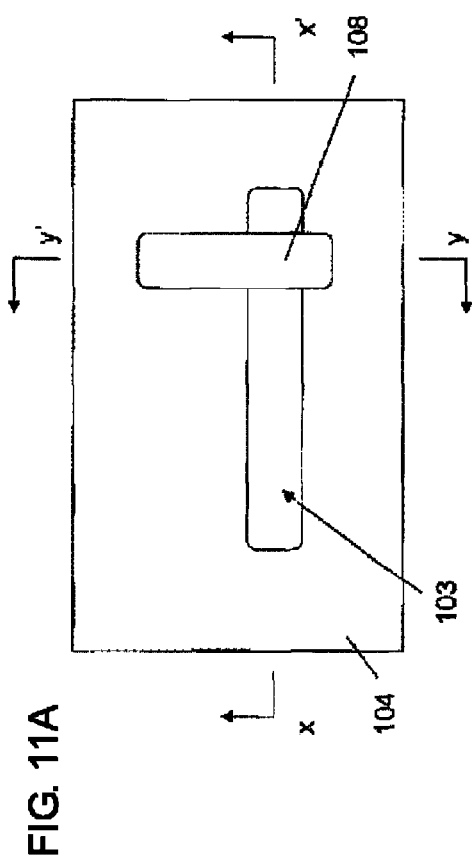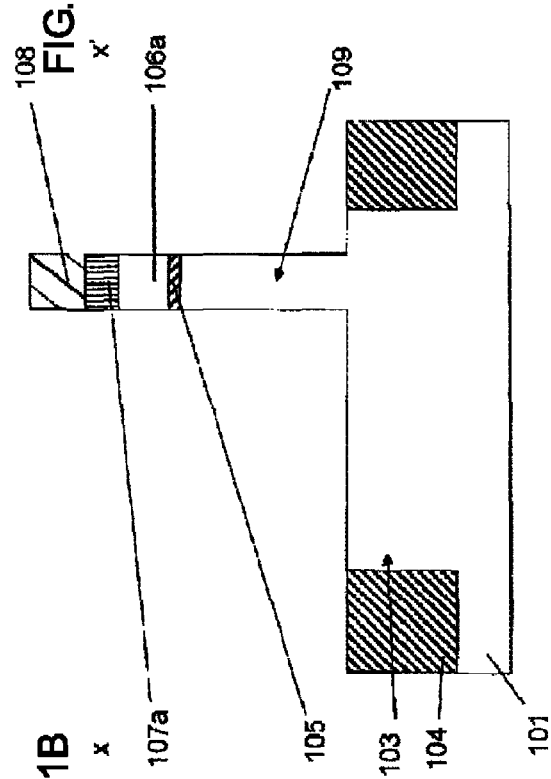

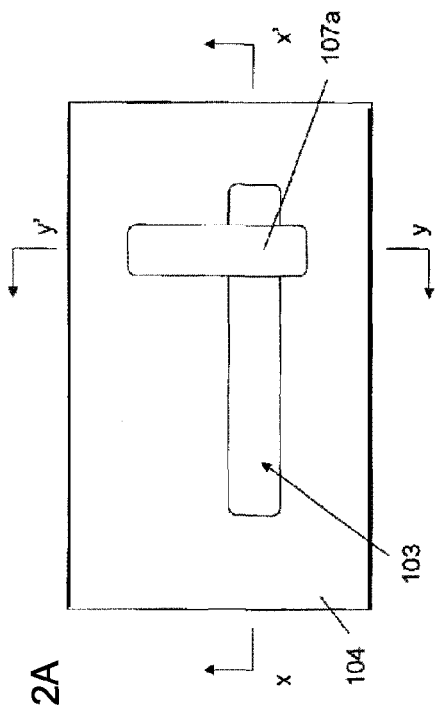
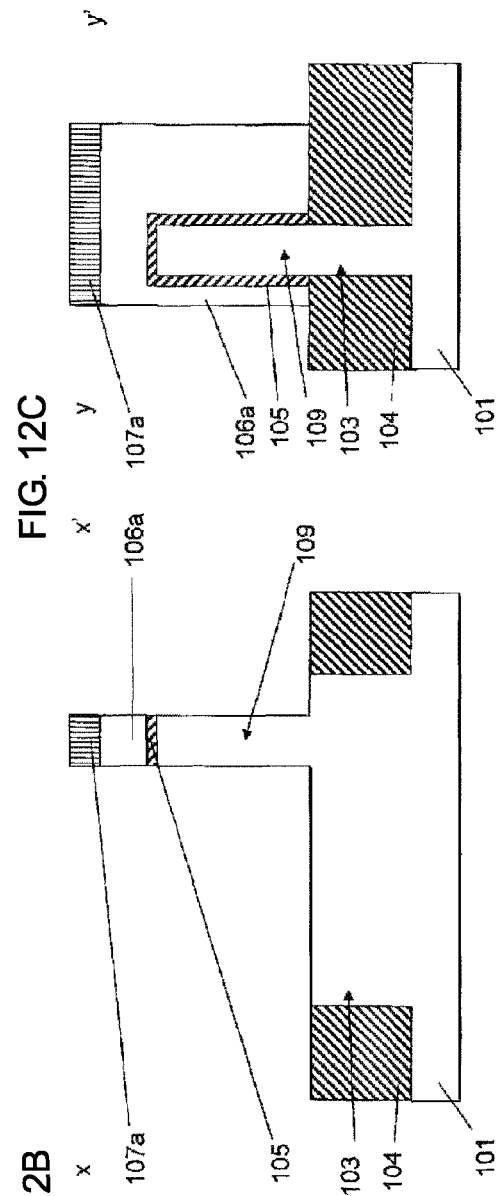
FIG. 12A
FIG. 12B
FIG. 12C

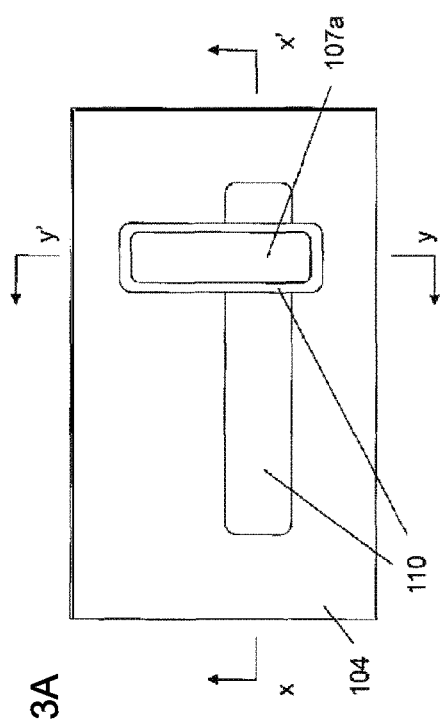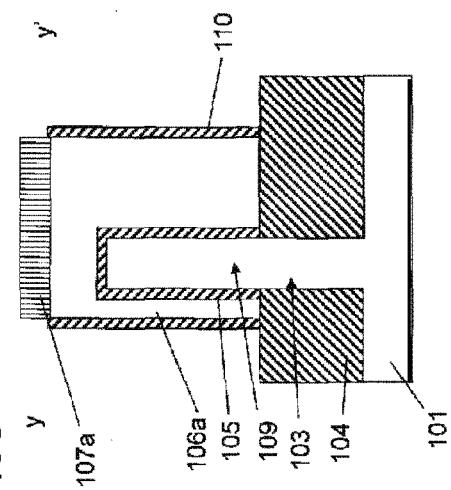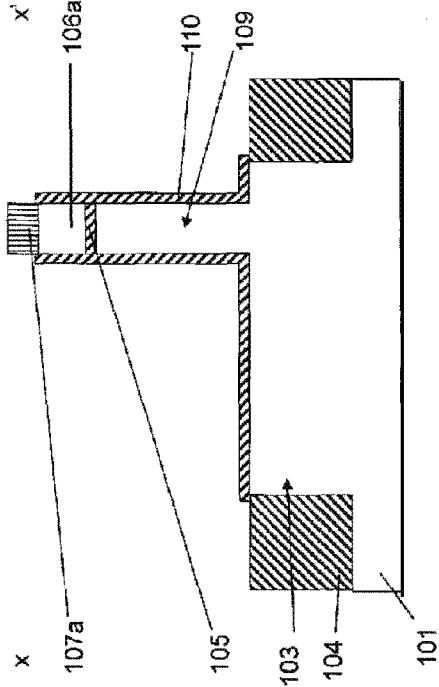
FIG. 13A
FIG. 13B
FIG. 13C

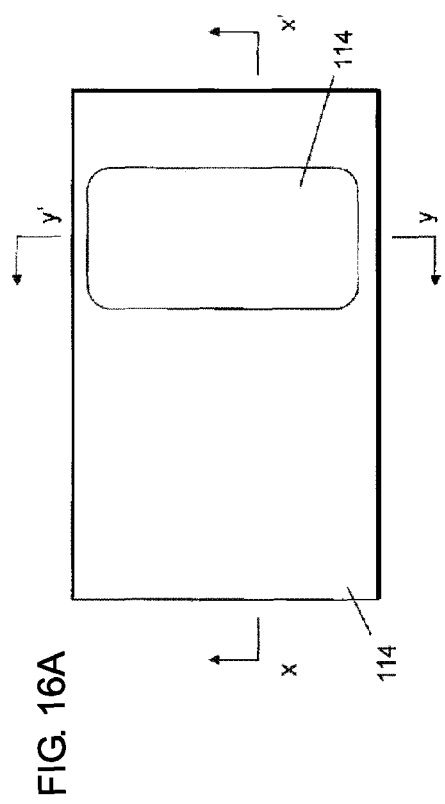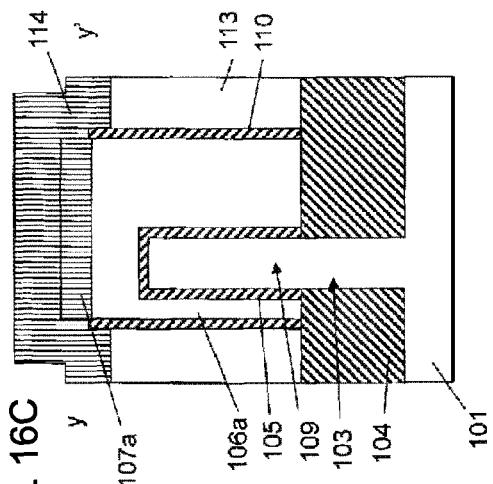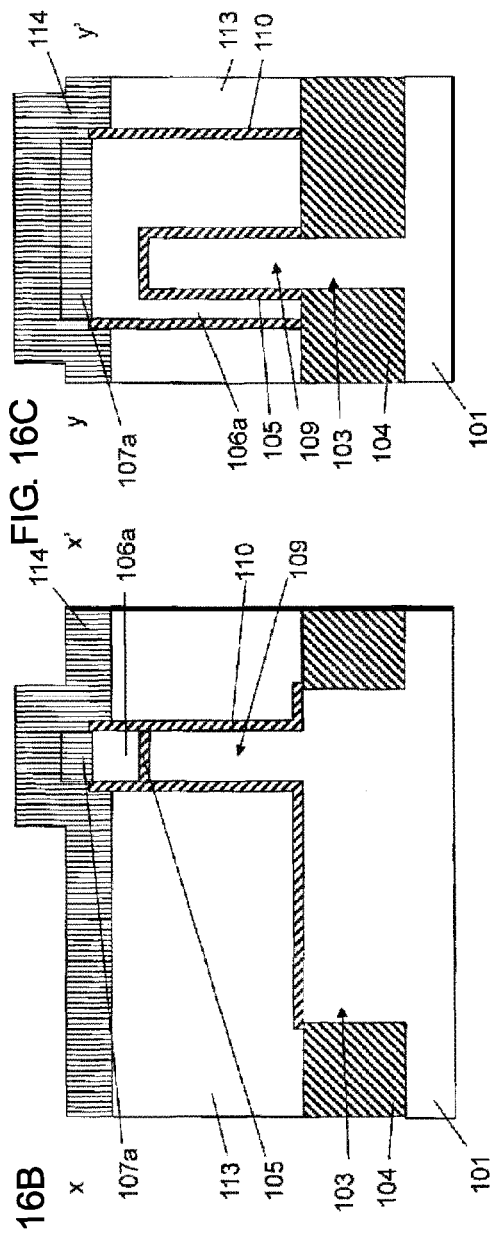

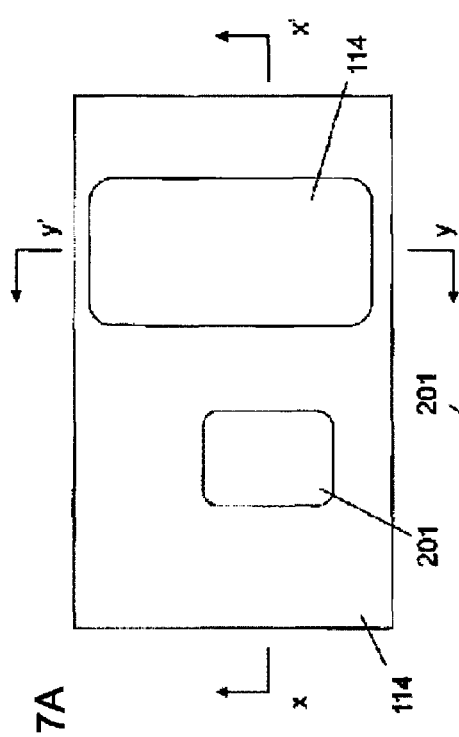
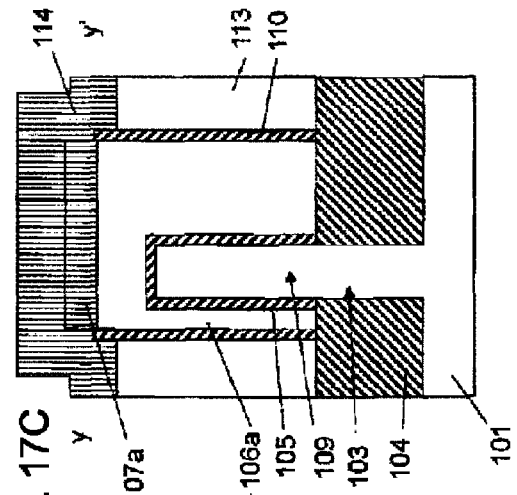
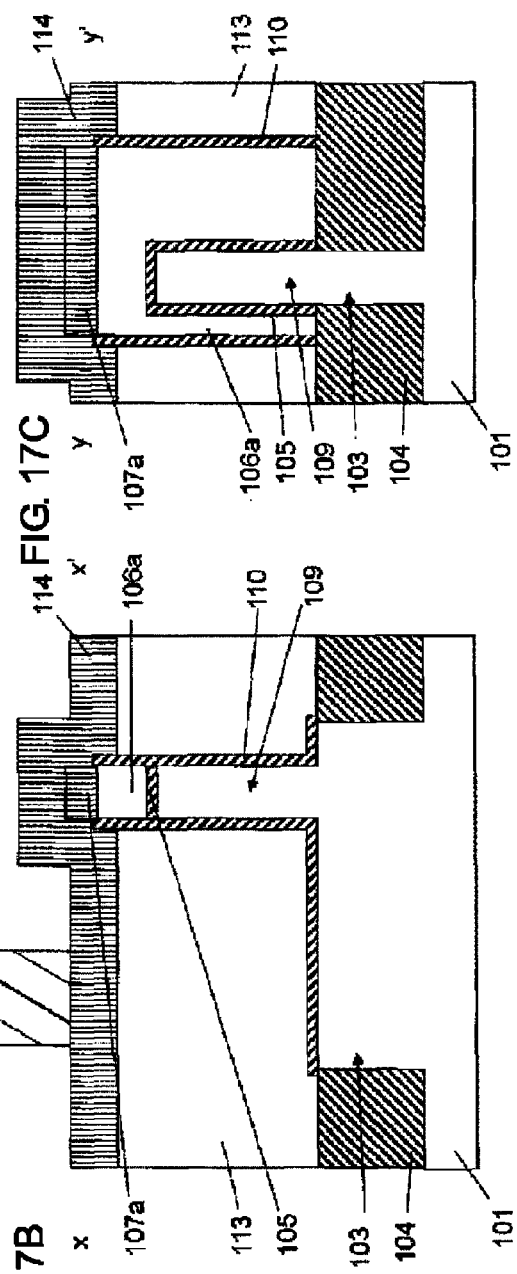
FIG. 17A
FIG. 17B
FIG. 17C

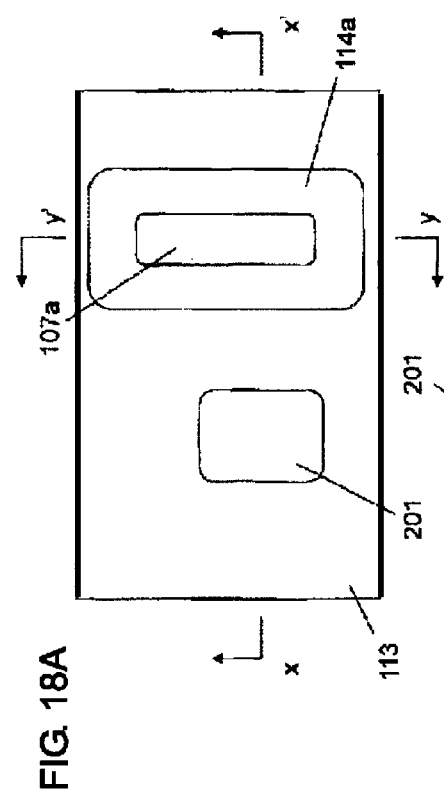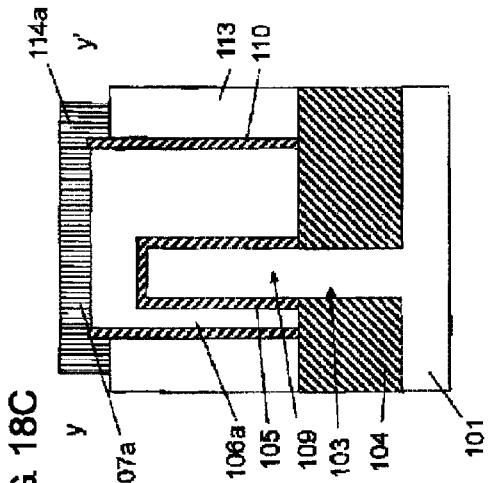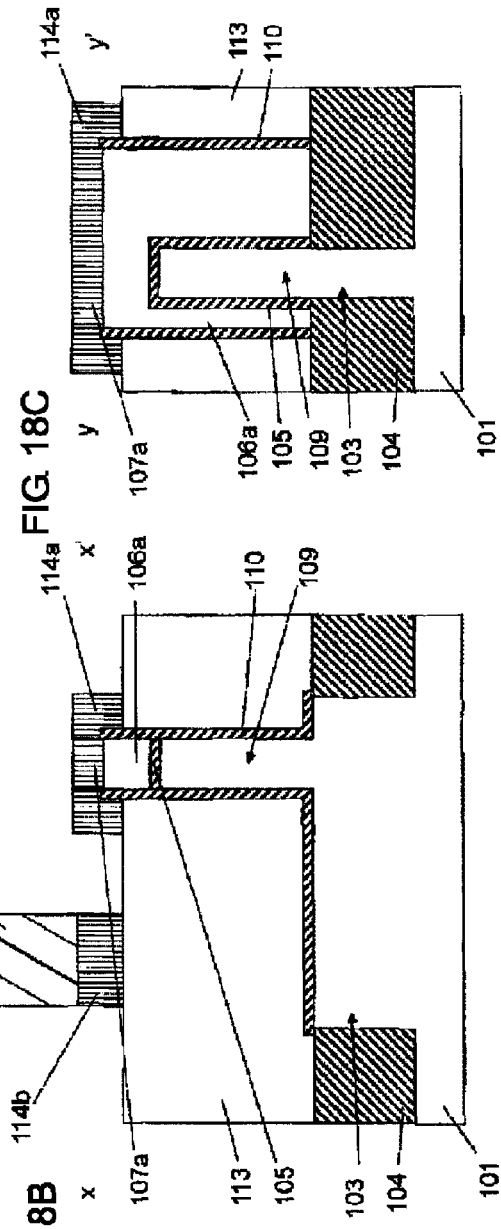

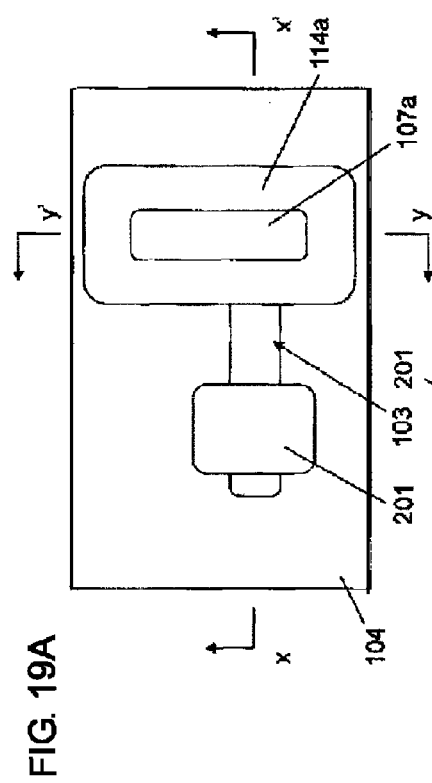
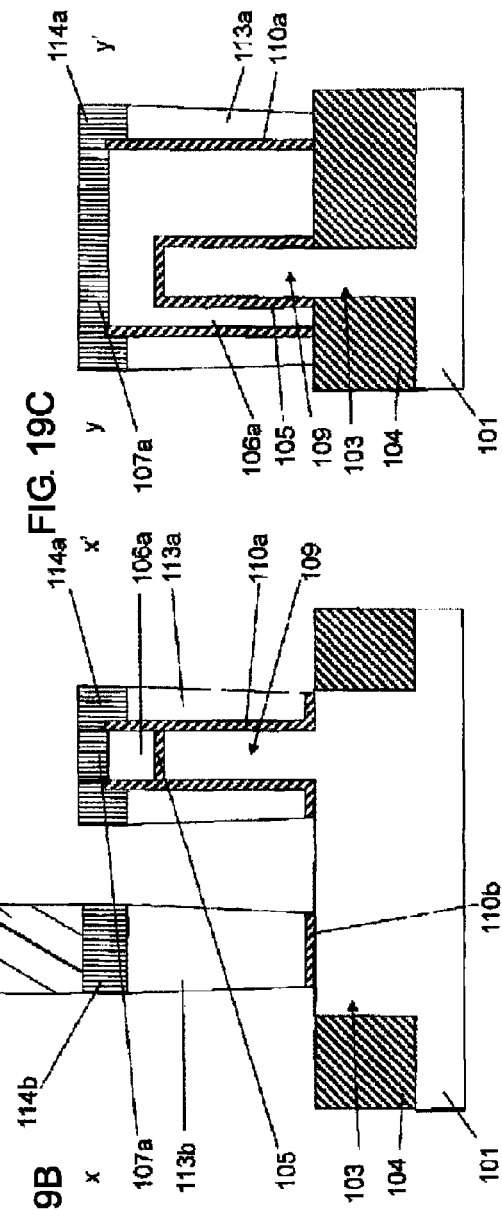
FIG. 19A
FIG. 19B
FIG. 19C

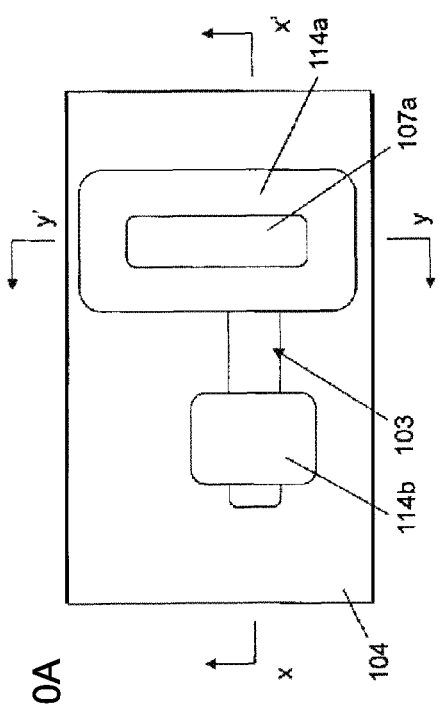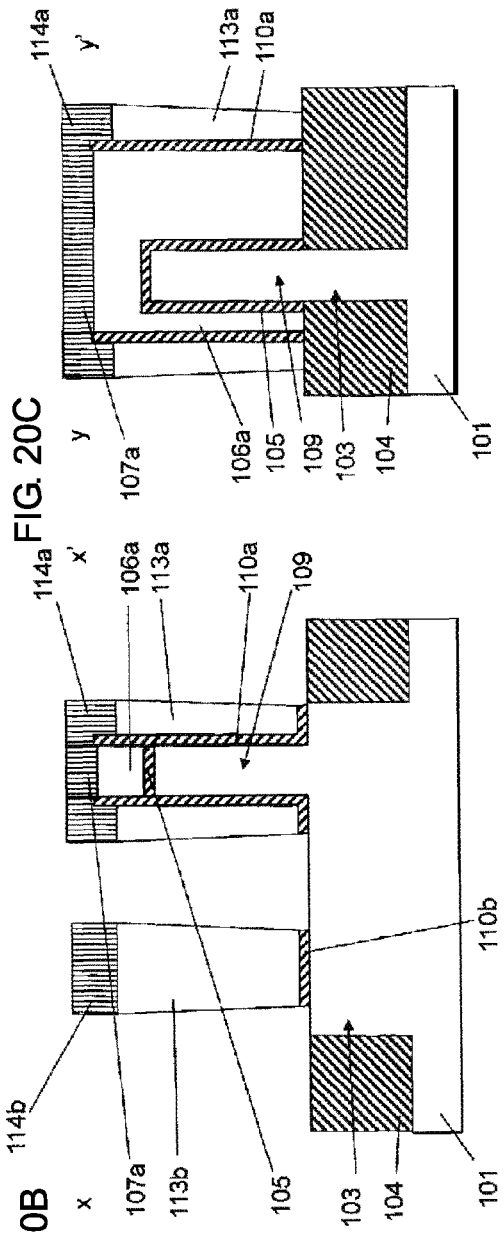
FIG. 20A
FIG. 20B
FIG. 20C

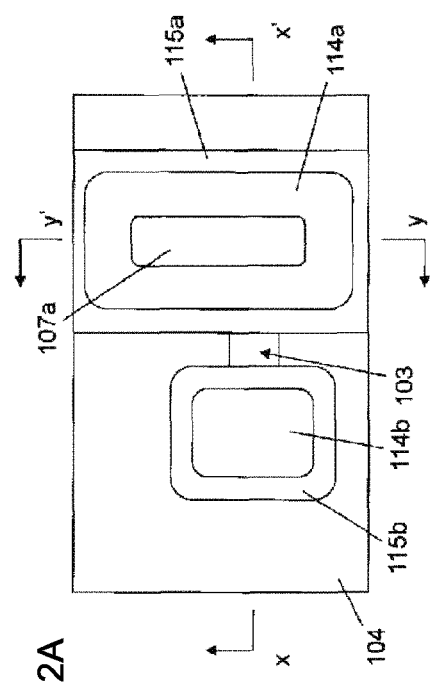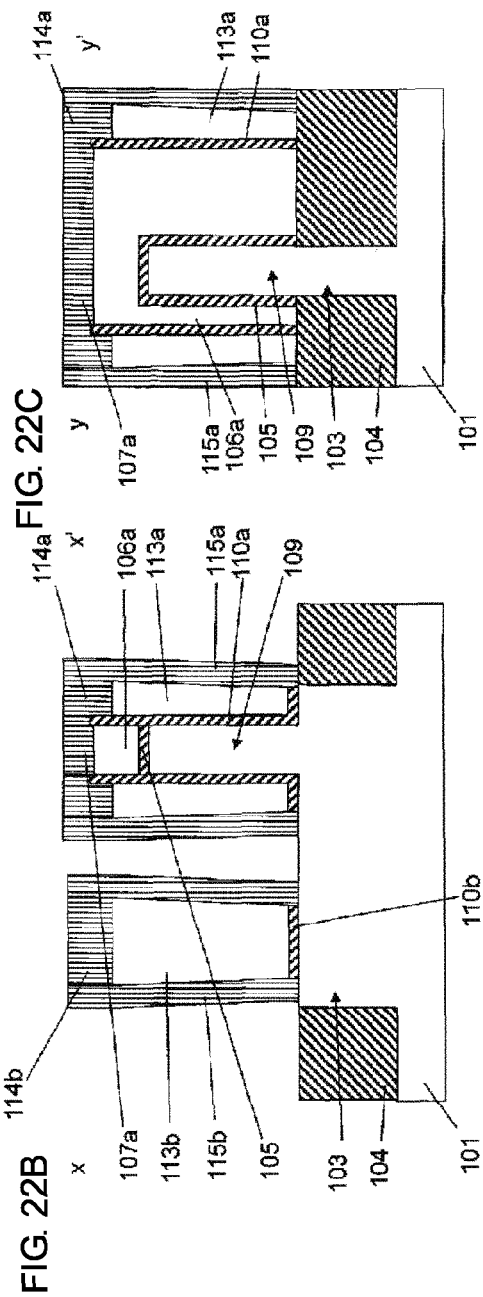
FIG. 22A
FIG. 22B
FIG. 22C

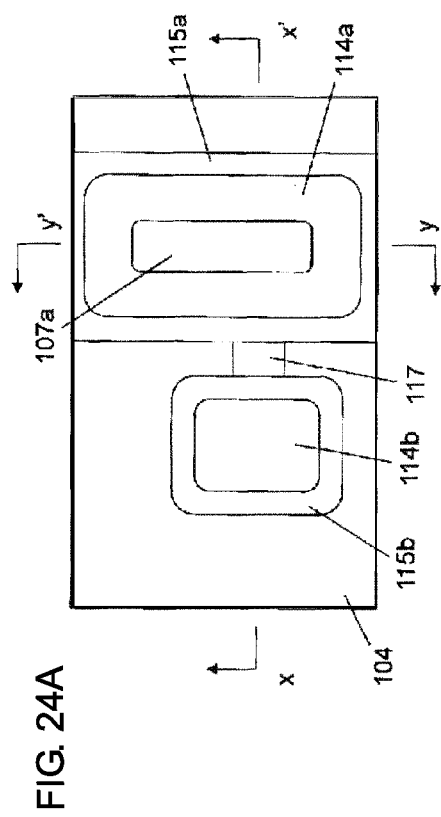
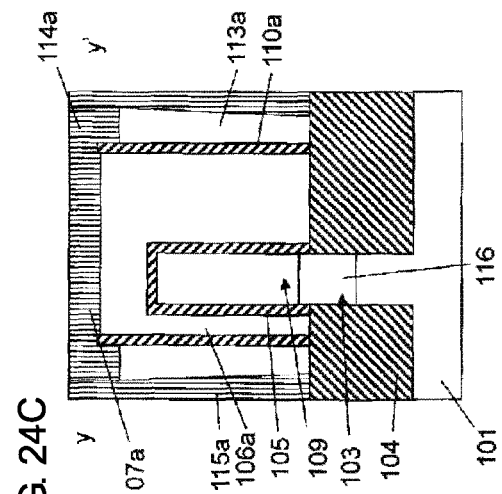
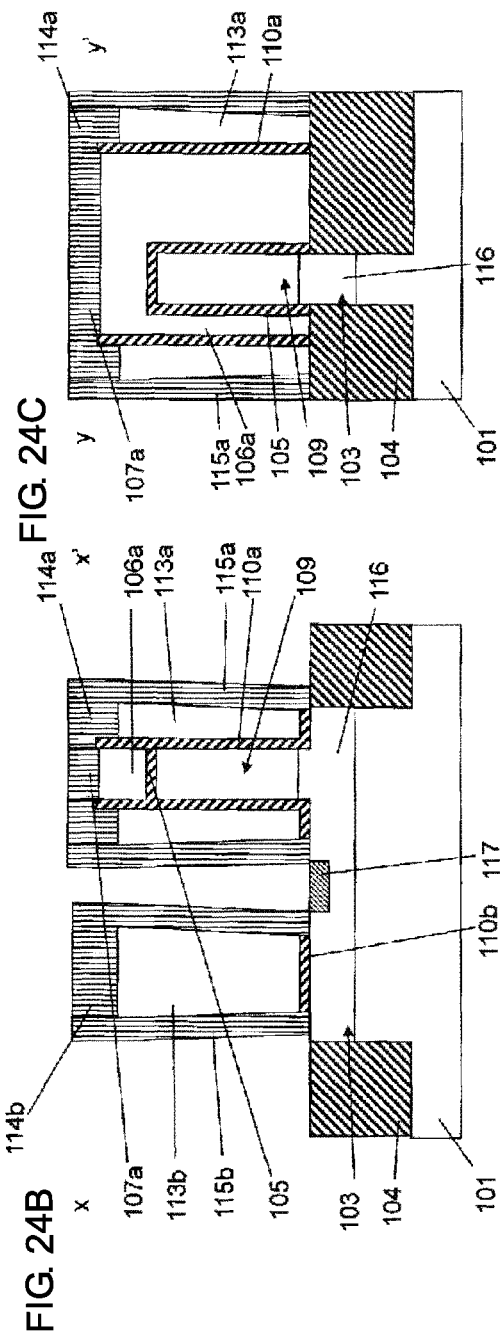
FIG. 24A
FIG. 24B
FIG. 24C

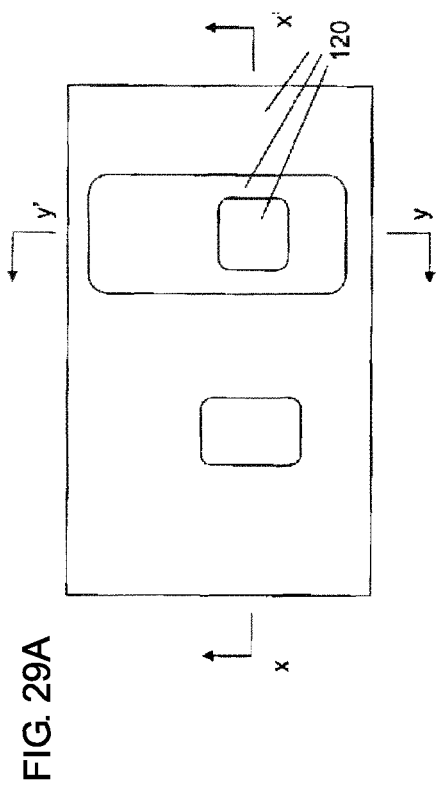
FIG. 29A
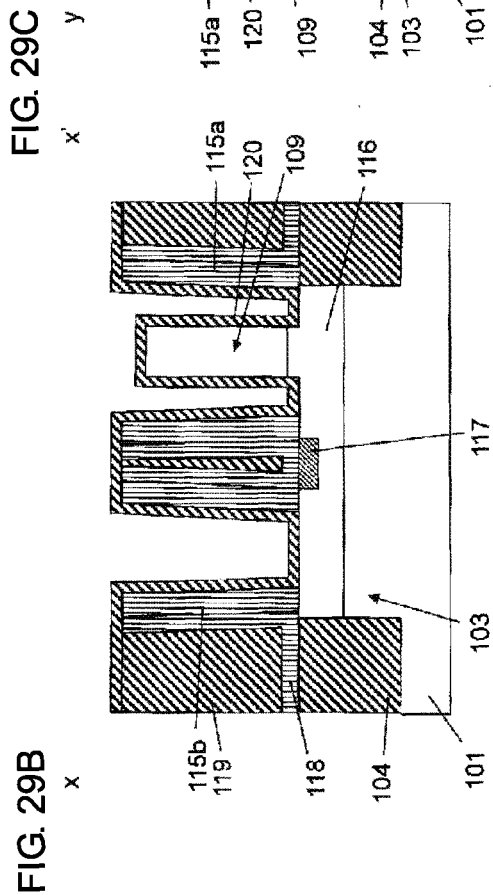
FIG. 29B
FIG. 29C

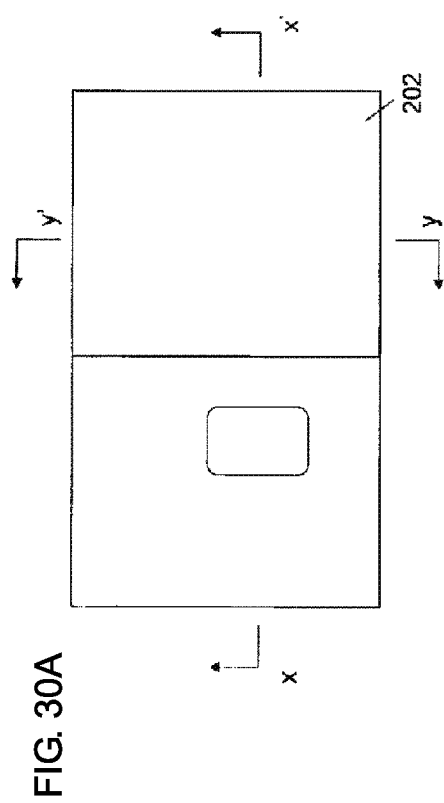
FIG. 30A
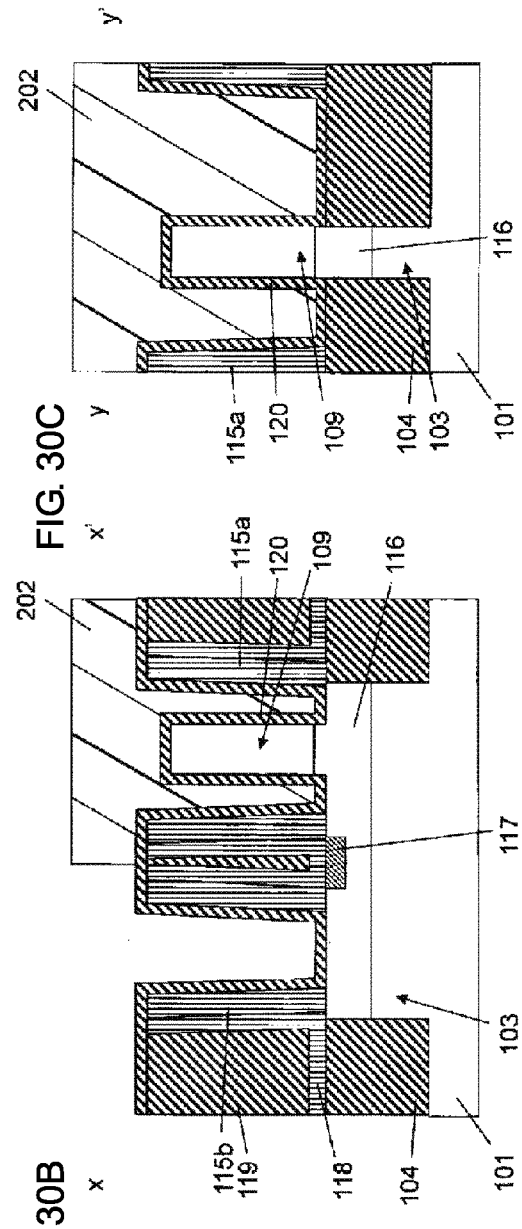
FIG. 30B
FIG. 30C

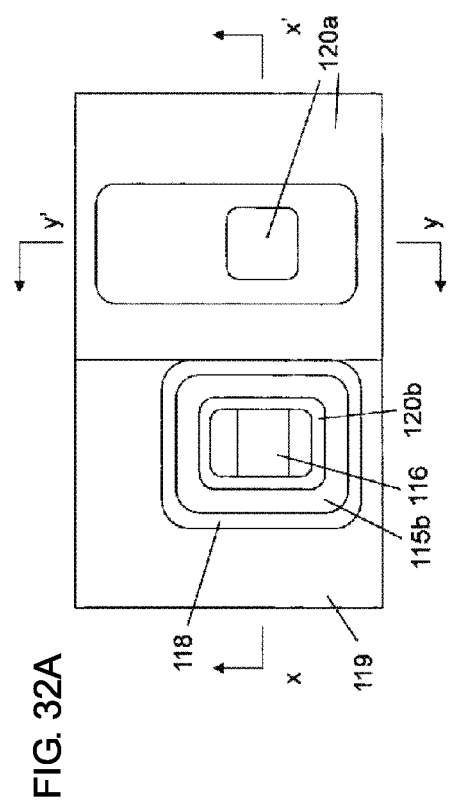
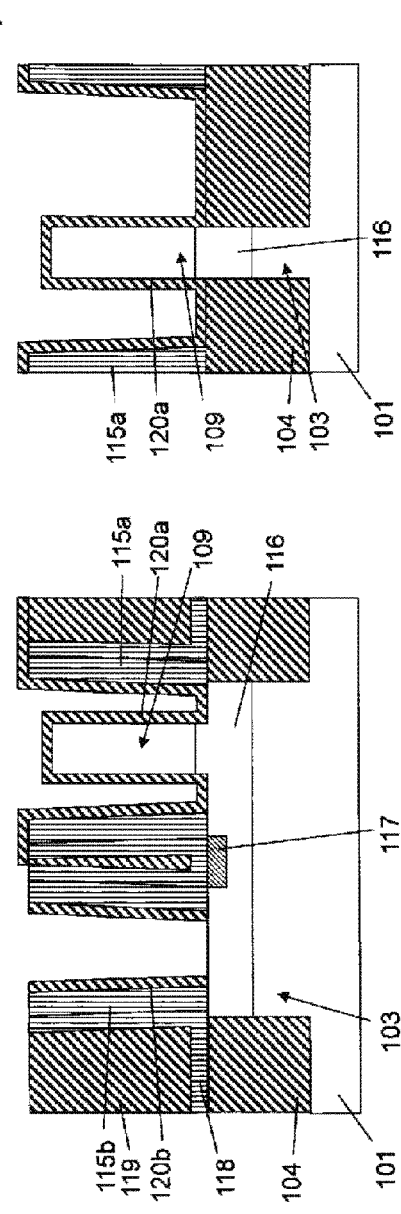
FIG. 32A
FIG. 32B
FIG. 32C

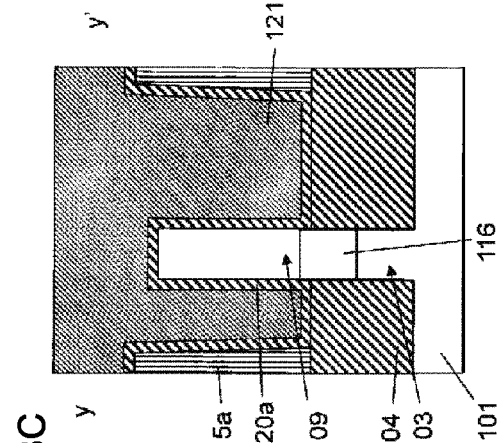
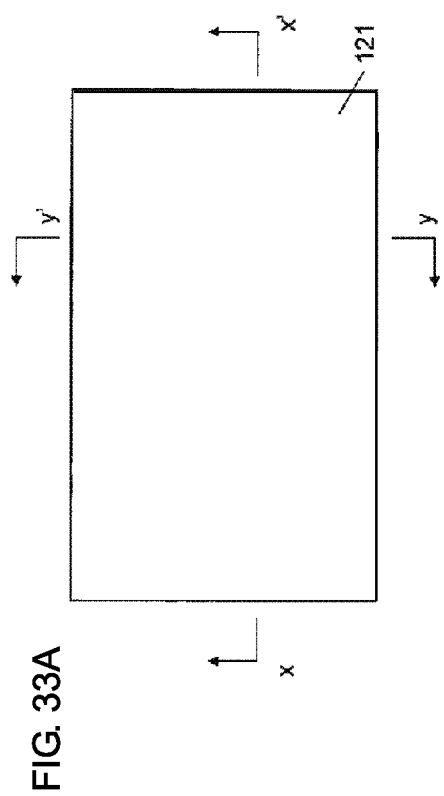
FIG. 33A
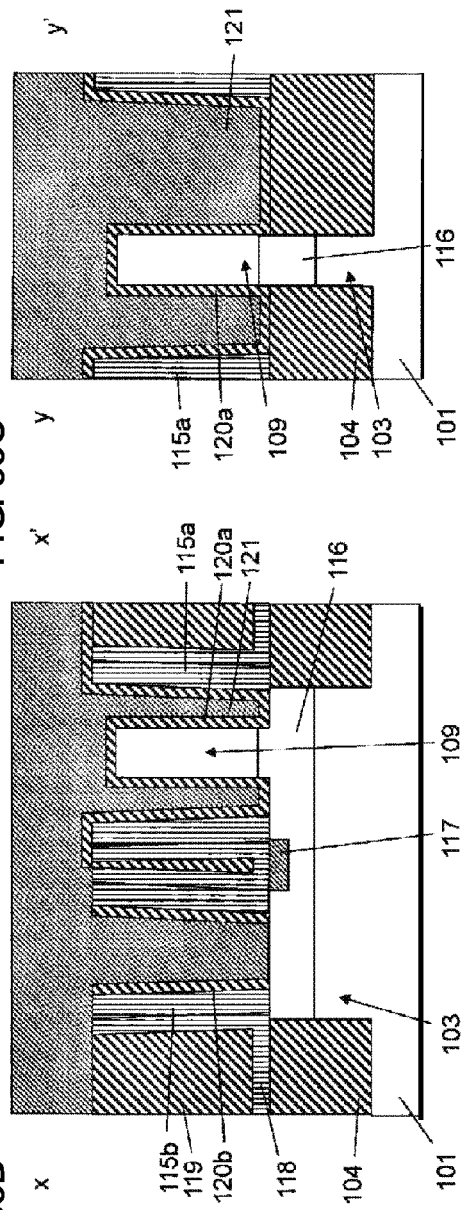
FIG. 33B
FIG. 33C

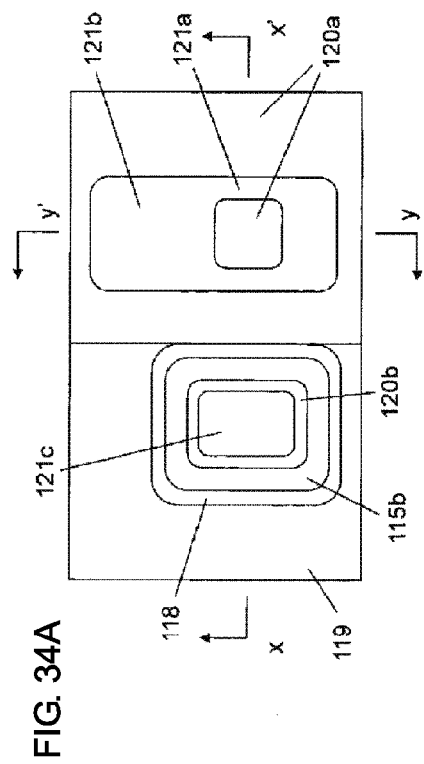
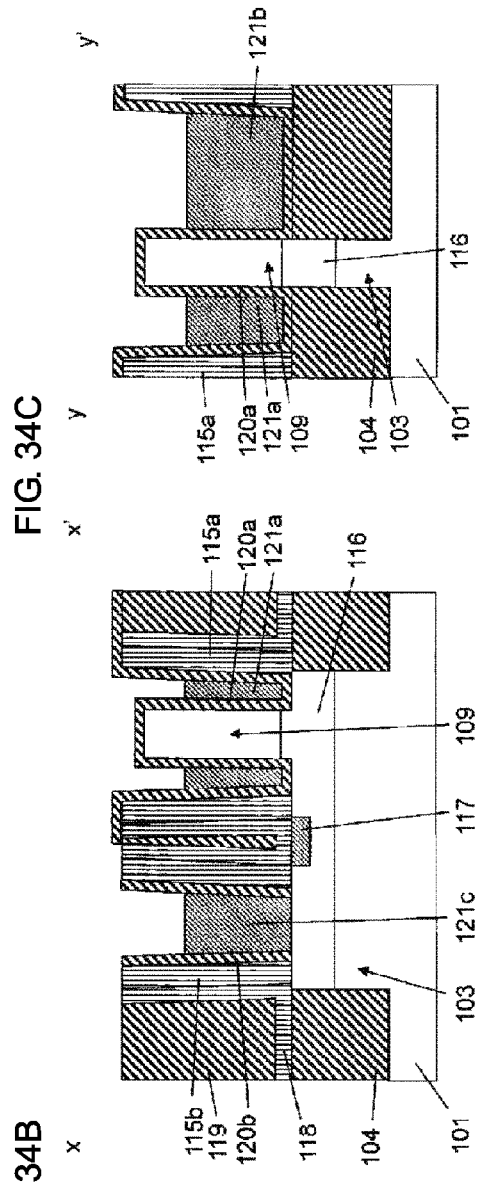
FIG. 34A
FIG. 34B
FIG. 34C

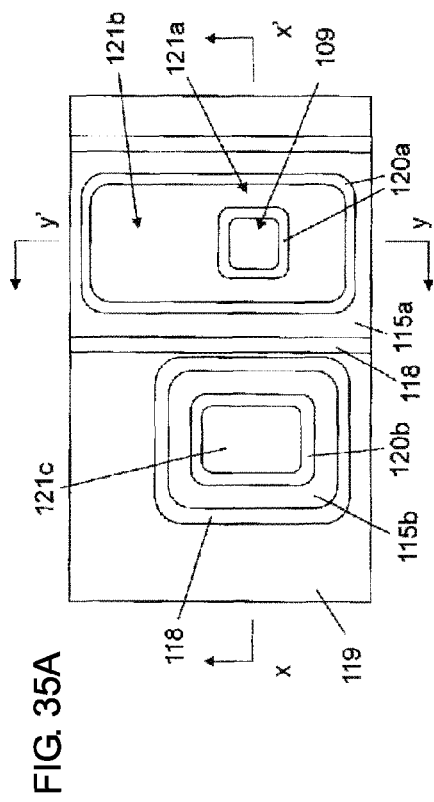
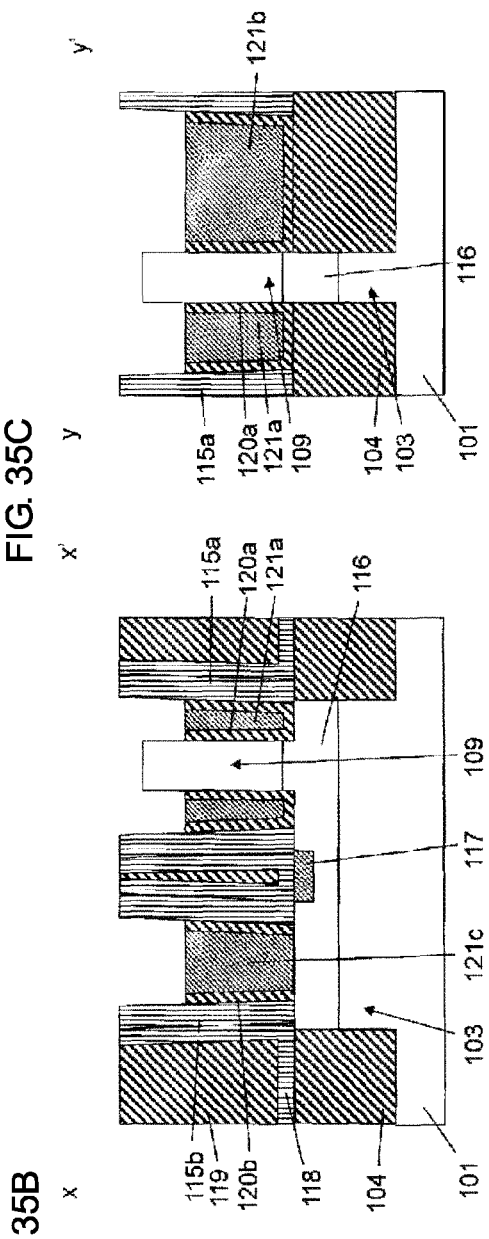
FIG. 35A
FIG. 35B
FIG. 35C

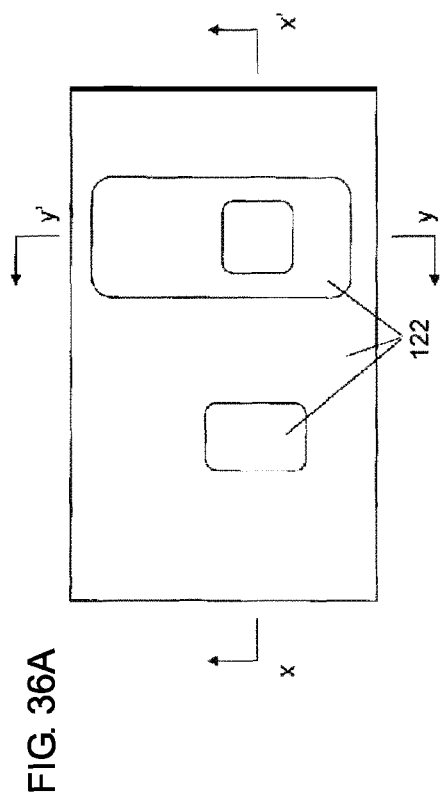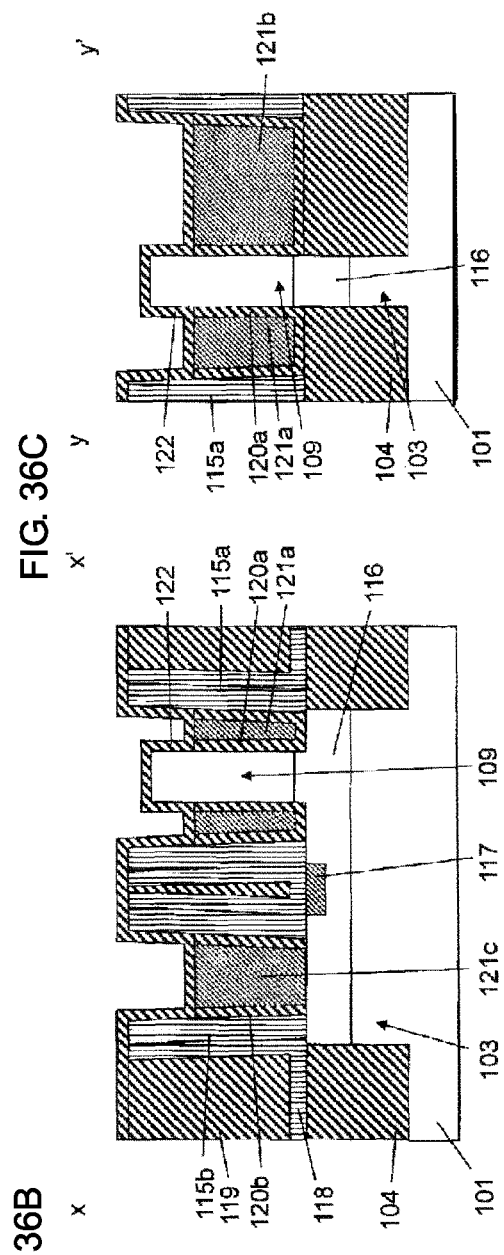
FIG. 36A
FIG. 36B
FIG. 36C

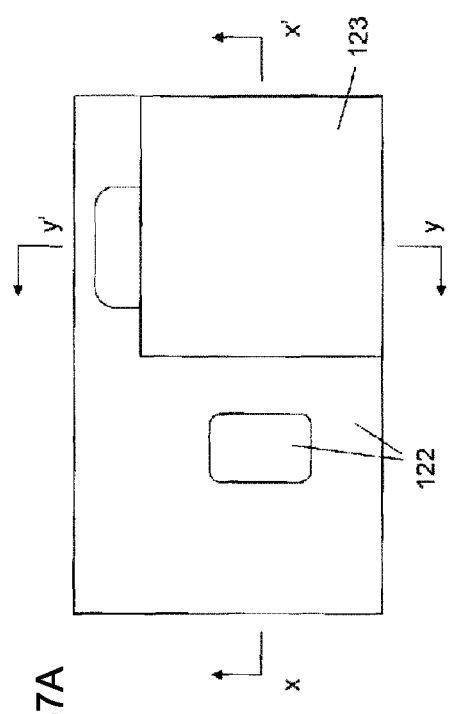
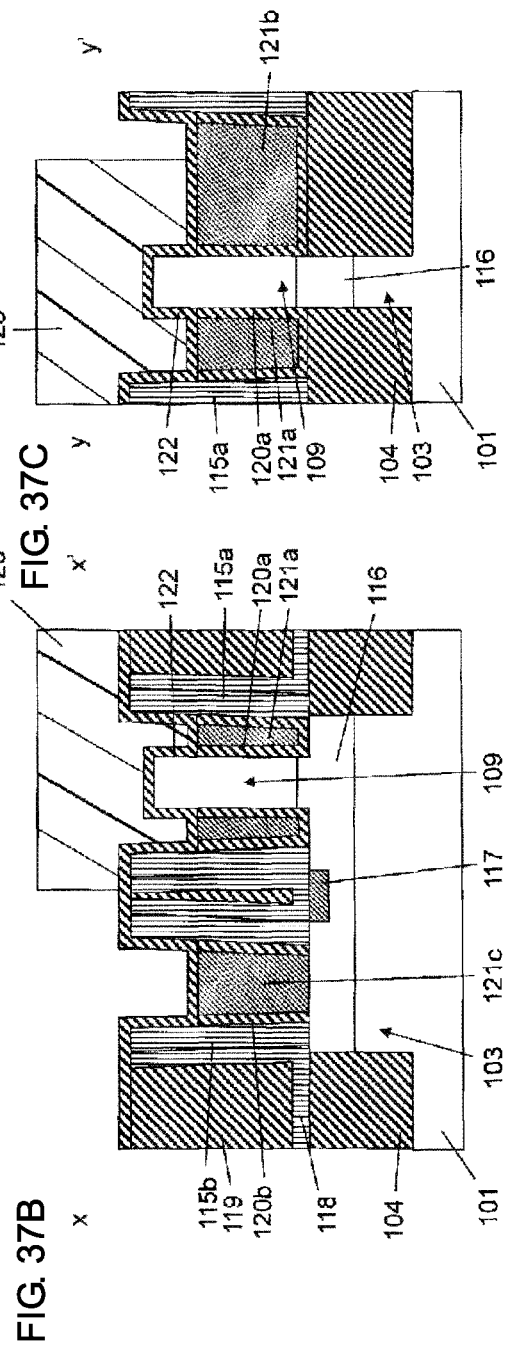
FIG. 37A
FIG. 37B
FIG. 37C

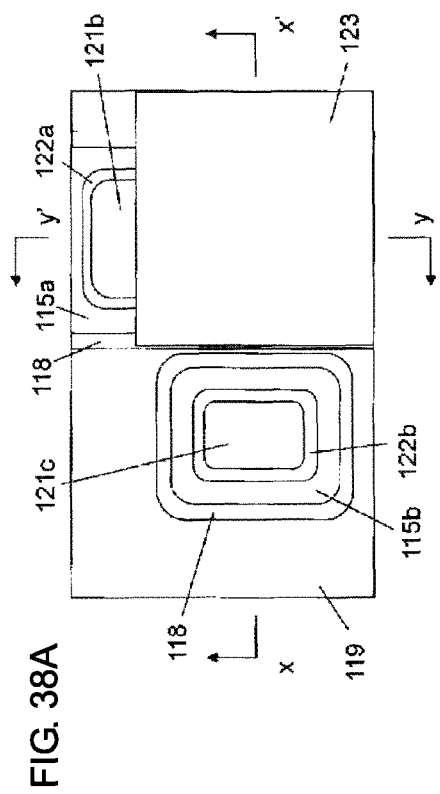
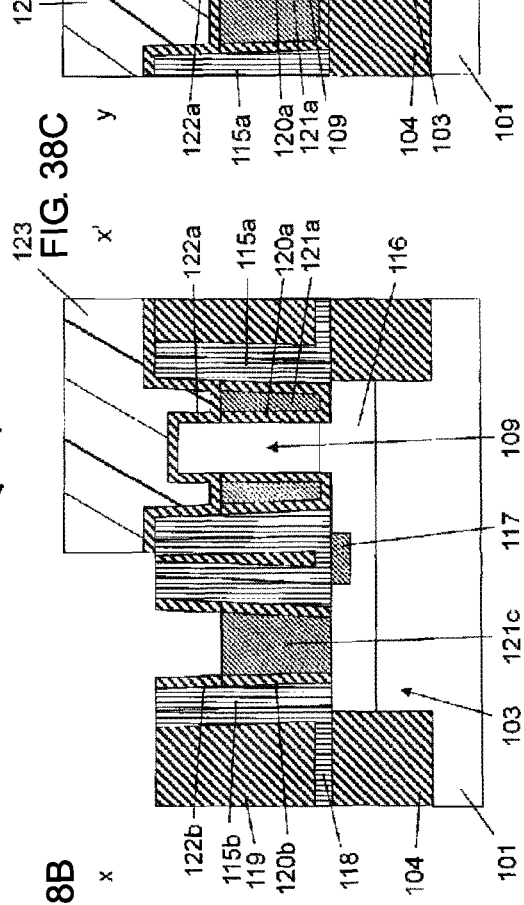
FIG. 38A
FIG. 38B
FIG. 38C

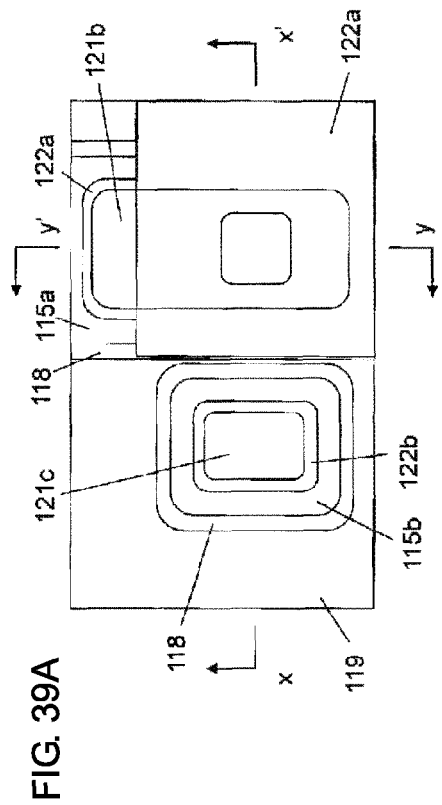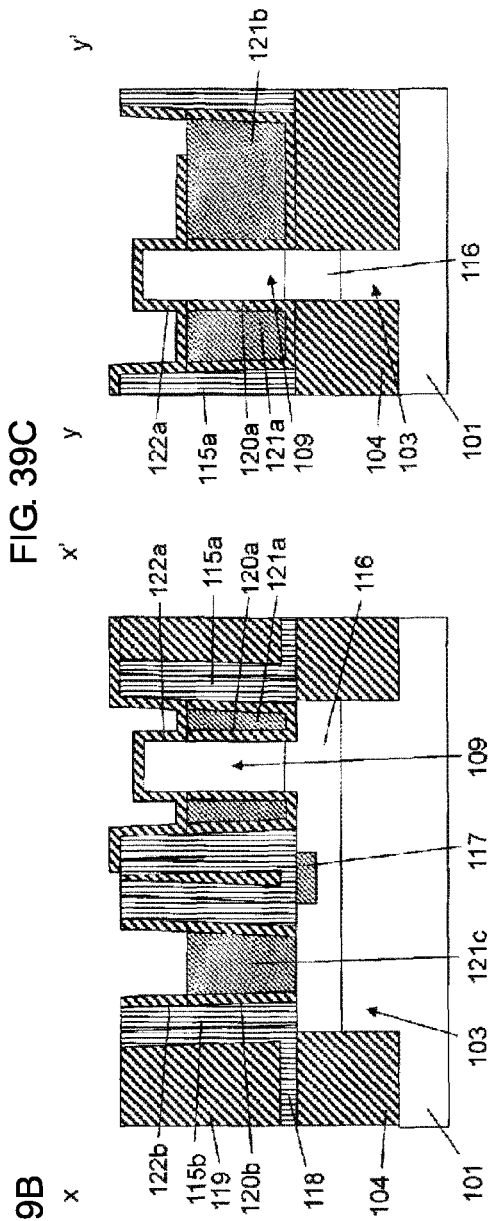
FIG. 39A
FIG. 39B
FIG. 39C

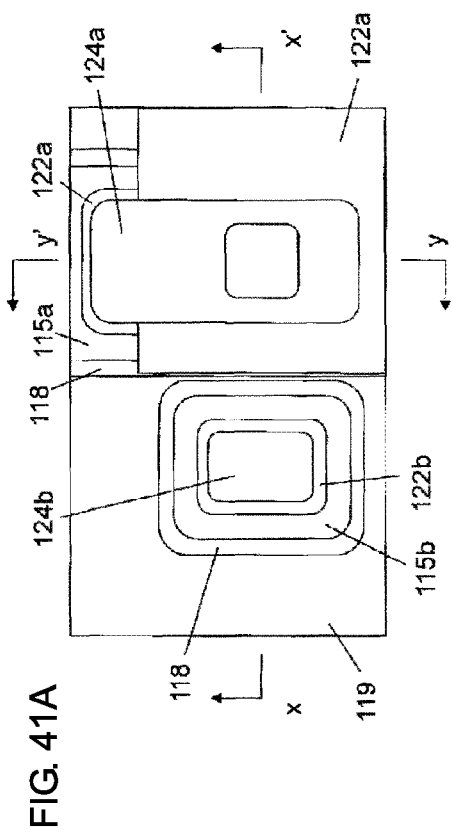
FIG. 41A
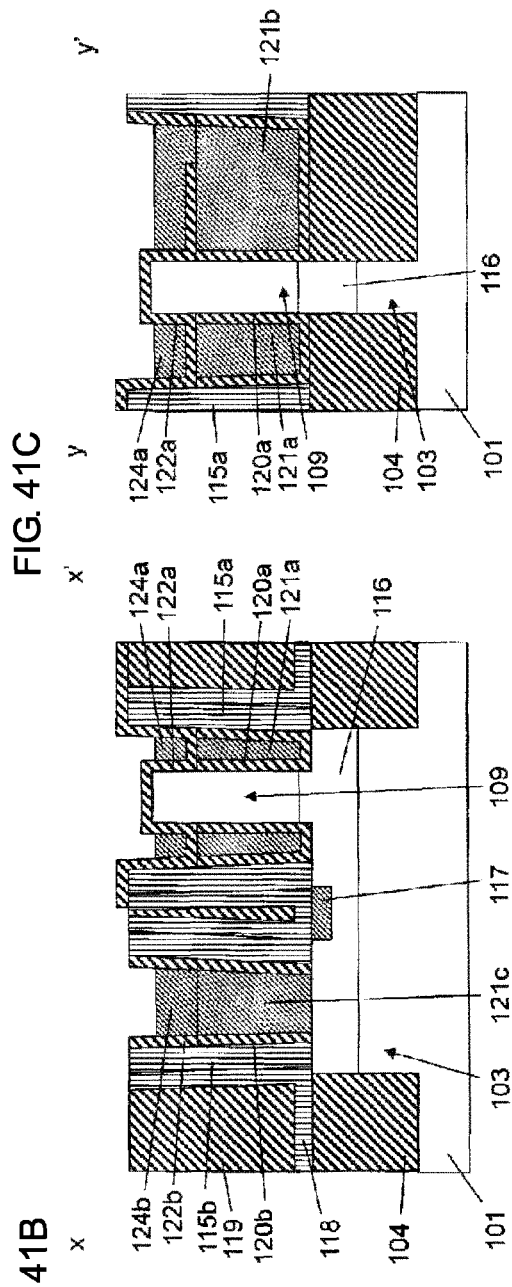
FIG. 41C
FIG. 41B

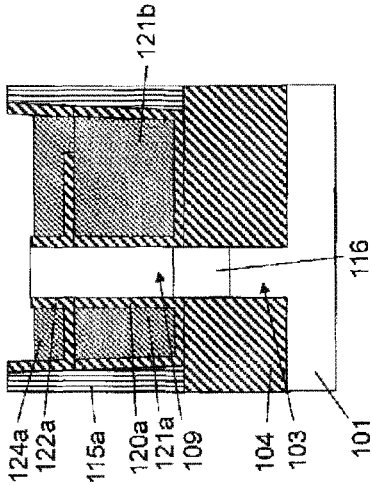
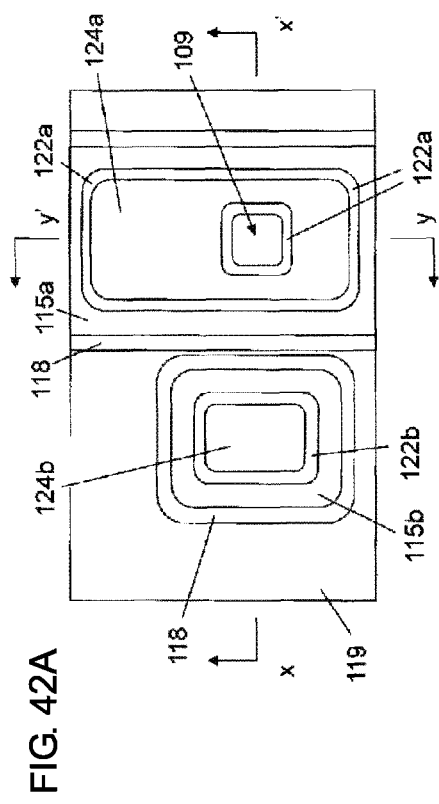
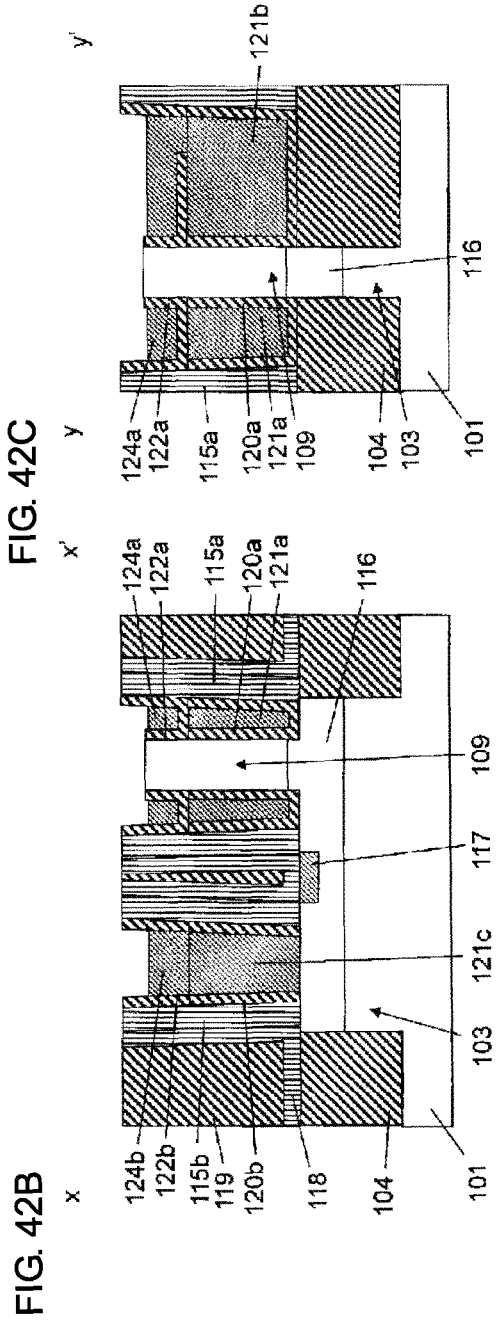
FIG. 42A
FIG. 42B
FIG. 42C

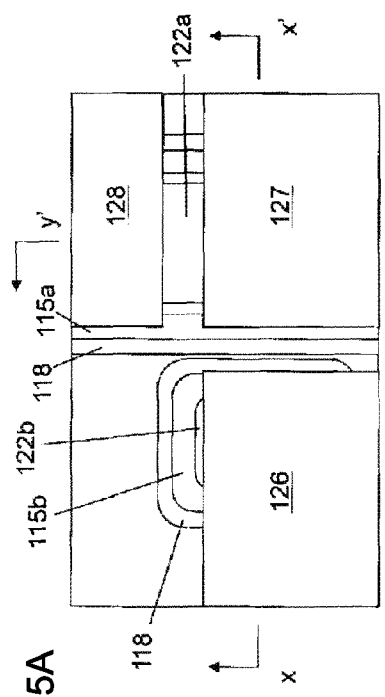
FIG. 45A
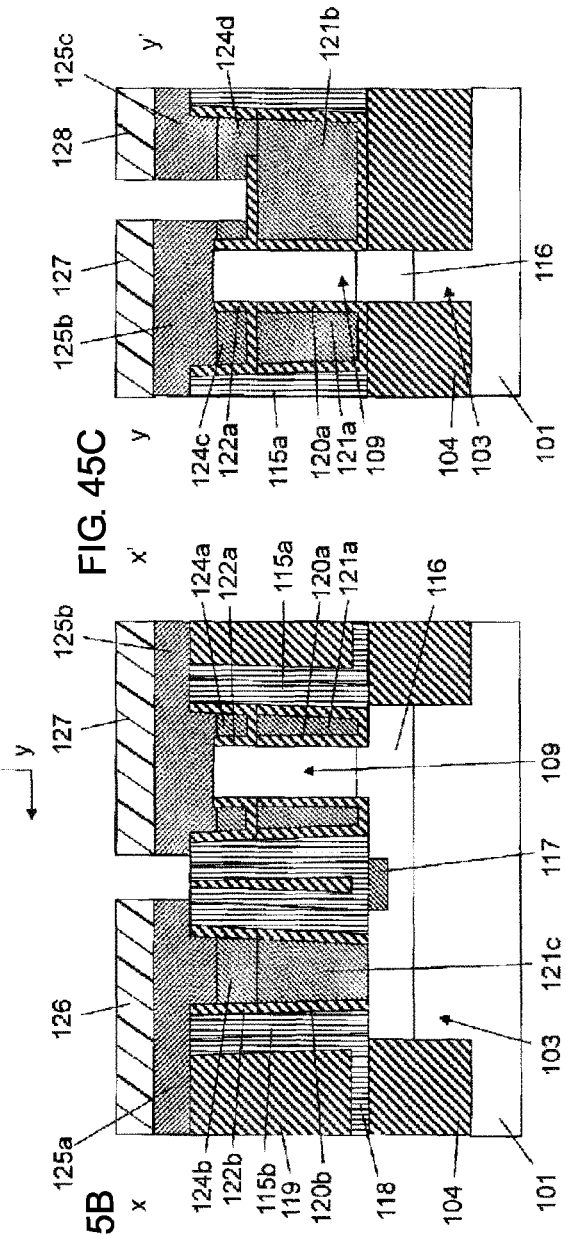
FIG. 45B
FIG. 45C

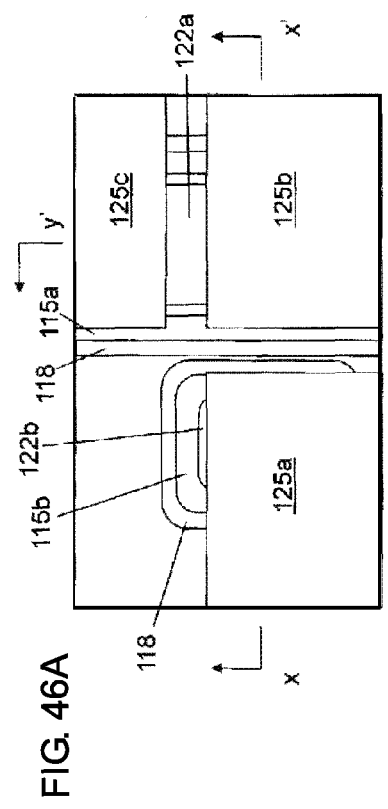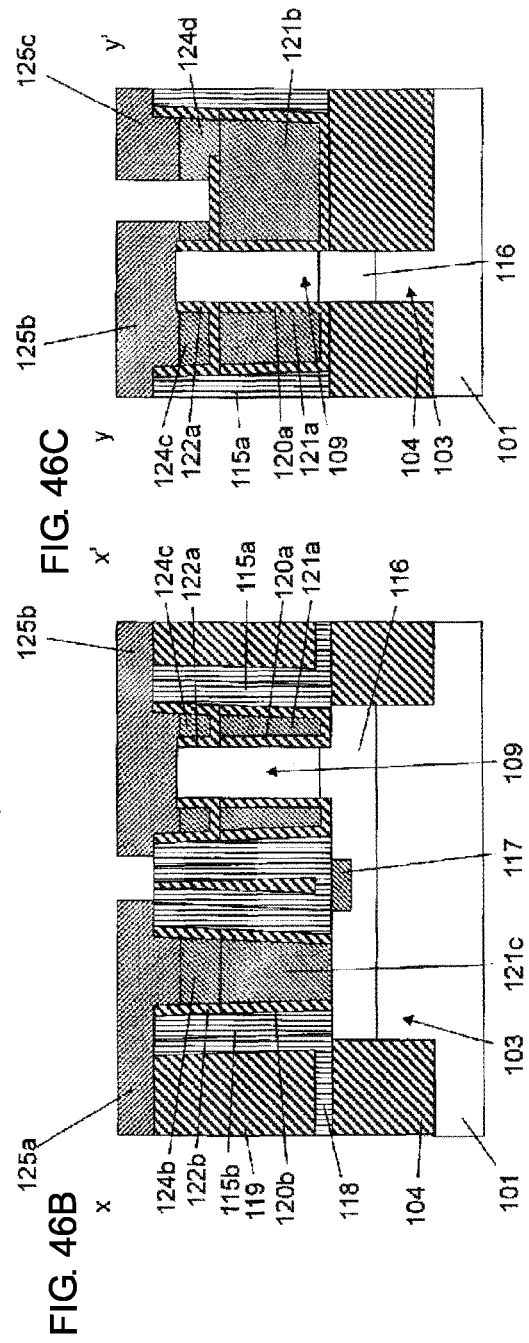
FIG. 46A
FIG. 46B
FIG. 46C

METHOD FOR PRODUCING SEMICONDUCTOR DEVICE AND SEMICONDUCTOR DEVICE

CROSS REFERENCE TO RELATED APPLICATION

The present application is a continuation of copending international patent application PCT/JP2014/055668, filed Mar. 5, 2014, the entire contents of which are incorporated herein by reference.

BACKGROUND OF THE INVENTION

Field of the Invention

The present invention relates to a method for producing a semiconductor device and to a semiconductor device.

Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

According to a typical method for producing an SGT, a silicon pillar on which a pillar-shaped nitride film hard mask has been formed is formed by using a mask for forming the silicon pillar, a planar silicon layer is formed at the bottom portion of the silicon pillar by using a mask for forming the planar silicon layer, and a gate line is formed by using a mask for forming the gate line (e.g., refer to Japanese Unexamined Patent Application Publication No. 2009-182317). In other words, three masks are used to form a silicon pillar, a planar silicon layer, and a gate line.

In a typical method for producing an SGT, a deep contact hole is formed in order to connect an upper portion of a planar silicon layer and a metal wire (e.g., refer to Japanese Unexamined Patent Application Publication No. 2009-182317). With reduction in the size of devices, the aspect ratio (depth/diameter) of contact holes increases. The increase in the aspect ratio causes a decrease in the etching rate. Furthermore, with reduction in the size of a pattern, the thickness of a resist decreases. If the thickness of the resist decreases, the resist is also etched during etching, which makes it difficult to form a deep contact hole.

A metal gate-last process in which a metal gate is formed after a high-temperature process has been employed in actual production of typical MOS transistors in order to achieve both a metal gate process and a high-temperature process (refer to IEDM 2007, K. Mistry et. al, pp. 247-250). A gate is formed using polysilicon, an interlayer insulating film is deposited, the polysilicon gate is exposed by chemical mechanical polishing and etched, and then a metal is deposited. Thus, a metal gate-last process in which a metal gate is formed after a high-temperature process needs to be also employed in making SGTs in order to achieve both a metal gate process and a high-temperature process.

If an upper portion of a hole is narrower than a lower portion of the hole during filling with a metal, the upper portion of the hole is filled with the metal first, resulting in formation of holes.

In typical MOS transistors, a first insulating film is used to decrease parasitic capacitance between the gate line and the substrate. For example, in a FINFET (refer to IEDM 2010 CC. Wu, et. al, 27.1.1-27.1.4), a first insulating film is formed around one fin-shaped semiconductor layer and etched back to expose the fin-shaped semiconductor layer in order to decrease parasitic capacitance between the gate line and the substrate. Accordingly, the first insulating film needs to be also used in an SGT in order to decrease parasitic capacitance between the gate line and the substrate. Since such an SGT includes a pillar-shaped semiconductor layer in addition to a fin-shaped semiconductor layer, special consideration is required to form the pillar-shaped semiconductor layer.

As the width of a silicon pillar decreases, it becomes more difficult to make an impurity be present in the silicon pillar because the density of silicon is $5 \times 10^{22}/cm^3$.

In typical SGTs, it has been proposed that the channel concentration is set to be a low impurity concentration of $10^{17}$ $cm^{-3}$ or less and the threshold voltage is determined by changing the work function of a gate material (e.g., refer to Japanese Unexamined Patent Application Publication No. 2004-356314).

It has been disclosed that, in planar MOS transistors, the sidewall of an LDD region is formed of a polycrystalline silicon having the same conductivity type as a low-concentration layer, and therefore surface carriers of the LDD region are induced by the difference in work function and the impedance of the LDD region can be reduced compared with oxide film sidewall LDD-type MOS transistors (e.g., refer to Japanese Unexamined Patent Application Publication No. 11-297984). It has also been disclosed that the polycrystalline silicon sidewall is electrically insulated from a gate electrode. The drawings show that the polycrystalline silicon sidewall is insulated from a source and a drain by an interlayer insulating film.

SUMMARY OF THE INVENTION

Accordingly, it is an object to provide a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

A method for producing a semiconductor device according to an aspect of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer; a fourth step of, after the third step, forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer; a fifth step of, after the fourth step, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a first gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the first gate insulating film at a bottom portion of the region where the first dummy contact has been present, removing the first gate insulating film at a bottom portion of the region where the first dummy contact has been present, depositing a first metal, and etching back the first metal to form a gate electrode, a gate line, and a first contact; and a sixth step of, after the fifth step, depositing a second gate insulating film around the pillar-shaped semiconductor layer, on the gate electrode, on the gate line, and on the first contact, removing a portion of the second gate insulating film on the gate line and the second gate insulating film on the first contact, depositing a second metal, etching back the second metal, removing the second gate insulating film on the pillar-shaped semiconductor layer, depositing a third metal, and etching portions of the third metal and the second metal to form a second contact in which the second metal surrounds a sidewall of an upper portion of the pillar-shaped semiconductor layer, a third contact formed on the gate line and made of the second metal, and a fourth contact formed on the first contact and made of the second metal, wherein the second contact has an upper portion connected to the upper portion of the pillar-shaped semiconductor layer.

An upper surface of the second dummy gate may have a larger area than a lower surface of the second dummy gate.

The method may further include depositing a contact stopper film after the fourth step.

The method may further include removing the first gate insulating film after the fifth step.

The second metal for the second contact may have a work function of 4.0 eV to 4.2 eV.

The second metal for the second contact may have a work function of 5.0 eV to 5.2 eV.

A semiconductor device according to another aspect of the present invention includes a fin-shaped semiconductor layer formed on a semiconductor substrate, a first insulating film formed around the fin-shaped semiconductor layer, a first contact formed on the fin-shaped semiconductor layer, a first gate insulating film formed around the first contact, a fourth contact formed on the first contact, and a second gate insulating film formed around the fourth contact.

An upper surface of the first contact may have a larger area than a lower surface of the first contact.

The semiconductor device may further include a pillar-shaped semiconductor layer formed on the fin-shaped semiconductor layer; a first gate insulating film formed around the pillar-shaped semiconductor layer; a gate electrode formed around the first gate insulating film and made of a first metal; a gate line connected to the gate electrode, extending in a direction perpendicular to a direction in which the fin-shaped semiconductor layer extends, and made of the first metal; a second diffusion layer formed in an upper portion of the fin-shaped semiconductor layer and a lower portion of the pillar-shaped semiconductor layer; a second gate insulating film formed around a sidewall of an upper portion of the pillar-shaped semiconductor layer; and a second contact formed around the second gate insulating film and made of a second metal, wherein the second contact has an upper portion connected to the upper portion of the pillar-shaped semiconductor layer, an upper surface of the gate electrode and the gate line has a larger area than a lower surface of the gate electrode and the gate line.

The first gate insulating film may also be formed around and at bottom portions of the gate electrode and the gate line.

The semiconductor device may further include a third contact formed on the gate line and made of the second metal.

The second metal for the second contact may have a work function of 4.0 eV to 4.2 eV.

The second metal for the second contact may have a work function of 5.0 eV to 5.2 eV.

According to the present invention, there can be provided a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

The method for producing a semiconductor device includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer. Thus, a fin-shaped semiconductor layer, a pillar-shaped semiconductor layer, a gate electrode, and a gate line can be formed by self-alignment, which decreases the number of steps.

A gate electrode, a gate line, and a first contact can be formed by simultaneously forming the second dummy gate and the first dummy contact, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a first gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the first gate insulating film at a bottom portion of the region where the first dummy contact has been present, removing the first gate insulating film at a bottom portion of the region where the first dummy contact has been present, depositing a first metal, and etching back the first metal. Therefore, etching may be performed by the thickness of the first gate insulating film, and thus a step of forming a deep contact hole is not required.

A second contact in which a second metal surrounds a sidewall of an upper portion of the pillar-shaped semiconductor layer, a third contact formed on the gate line and made of the second metal, and a fourth contact formed on the first contact and made of the second metal can be formed by depositing a second gate insulating film around the pillar-shaped semiconductor layer, on the gate electrode, on the gate line, and on the first contact, removing a portion of the second gate insulating film on the gate line and the second gate insulating film on the first contact, depositing a second metal, etching back the second metal, removing the second gate insulating film on the pillar-shaped semiconductor layer, depositing a third metal, and etching portions of the third metal and the second metal. Therefore, etching may be performed by the thickness of the second gate insulating film, and thus a step of forming a deep contact hole is not required.

Since the first gate insulating film at the bottom portion of the region where the first dummy contact has been present has been removed, the first gate insulating film remains on an inner surface of the fifth insulating film in the region where the first dummy contact has been present. The first gate insulating film is a highly insulating film formed by atomic layer deposition, and thus can insulate the first contact from the surrounding structure.

The first and second hard masks prevent the formation of a metal-semiconductor compound on the first and second dummy gates. Thus, a metal-semiconductor compound can be formed only on the fin-shaped semiconductor layer.

When the second polysilicon is etched, by employing reverse-taper etching, the area of an upper surface of the second dummy gate can be made larger than that of a lower surface of the second dummy gate. Thus, in filling with a metal for forming a gate, the formation of holes can be prevented. At the same time, the area of an upper surface of the first dummy contact can be made larger than that of a lower surface of the first dummy contact. Thus, in filling with a metal for a first contact, the formation of holes can be prevented.

A typical metal gate-last production process can be employed which includes forming a first dummy gate and a second dummy gate using a polysilicon, depositing an interlayer insulating film, performing chemical mechanical polishing to expose the first dummy gate and the second dummy gate, etching the polysilicon gate, and then depositing a metal. Therefore, a metal gate SGT can be easily produced.

If a metal gate-last process is used for an SGT, an upper portion of a pillar-shaped semiconductor layer is covered with a polysilicon gate. Therefore, it is difficult to form a diffusion layer in the upper portion of the pillar-shaped semiconductor layer. This requires formation of a diffusion layer in the upper portion of the pillar-shaped semiconductor layer before formation of a polysilicon gate. In contrast, according to the present invention, the upper portion of a pillar-shaped semiconductor layer can be made to function as an n-type semiconductor layer or a p-type semiconductor layer by the difference in work function between metal and semiconductor without forming a diffusion layer in the upper portion of the pillar-shaped semiconductor layer. Accordingly, a step of forming a diffusion layer in an upper portion of a pillar-shaped semiconductor layer can be omitted.

The first gate insulating film formed around and at bottom portions of the gate electrode and the gate line can insulate the gate electrode and the gate line from the pillar-shaped semiconductor layer and the fin-shaped semiconductor layer.

Other features which are considered as characteristic for the invention are set forth in the appended claims.

Although the invention is illustrated and described herein as embodied in a method of producing a semiconductor device and in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1A is a plan view illustrating a semiconductor device according to an embodiment of the present invention, FIG. 1B is a sectional view taken along line X-X' in FIG. 1A, and FIG. 1C is a sectional view taken along line Y-Y' in FIG. 1A.

FIG. 2A is a plan view illustrating a method for producing a semiconductor device according to an embodiment of the present invention, FIG. 2B is a sectional view taken along line X-X' in FIG. 2A, and FIG. 2C is a sectional view taken along line Y-Y' in FIG. 2A.

FIG. 3A is a plan view illustrating a method for producing a semiconductor device according to an embodiment of the present invention, FIG. 3B is a sectional view taken along line X-X' in FIG. 3A, and FIG. 3C is a sectional view taken along line Y-Y' in FIG. 3A.

FIG. 4A is a plan view illustrating a method for producing a semiconductor device according to an embodiment of the present invention, FIG. 4B is a sectional view taken along line X-X' in FIG. 4A, and FIG. 4C is a sectional view taken along line Y-Y' in FIG. 4A.

FIG. 6A is a plan view illustrating a method for producing a semiconductor device according to an embodiment of the present invention, FIG. 6B is a sectional view taken along line X-X' in FIG. 6A, and FIG. 6C is a sectional view taken along line Y-Y' in FIG. 6A.

FIG. 7A is a plan view illustrating a method for producing a semiconductor device according to an embodiment of the present invention, FIG. 7B is a sectional view taken along line X-X' in FIG. 7A, and FIG. 7C is a sectional view taken along line Y-Y' in FIG. 7A.

FIG. 11A is a plan view illustrating a method for producing a semiconductor device according to an embodiment of the present invention, FIG. 11B is a sectional view taken along line X-X' in FIG. 11A, and FIG. 11C is a sectional view taken along line Y-Y' in FIG. 11A.

FIG. 12A is a plan view illustrating a method for producing a semiconductor device according to an embodiment of the present invention, FIG. 12B is a sectional view taken along line X-X' in FIG. 12A, and FIG. 12C is a sectional view taken along line Y-Y' in FIG. 12A.

FIG. 13A is a plan view illustrating a method for producing a semiconductor device according to an embodiment of the present invention, FIG. 13B is a sectional view taken along line X-X' in FIG. 13A, and FIG. 13C is a sectional view taken along line Y-Y' in FIG. 13A.

FIG. 16A is a plan view illustrating a method for producing a semiconductor device according to an embodiment of the present invention, FIG. 16B is a sectional view taken along line X-X' in FIG. 16A, and FIG. 16C is a sectional view taken along line Y-Y' in FIG. 16A.

FIG. 17A is a plan view illustrating a method for producing a semiconductor device according to an embodiment of the present invention, FIG. 17B is a sectional view taken along line X-X' in FIG. 17A, and FIG. 17C is a sectional view taken along line Y-Y' in FIG. 17A.

FIG. 18A is a plan view illustrating a method for producing a semiconductor device according to an embodiment of the present invention, FIG. 18B is a sectional view taken along line X-X' in FIG. 18A, and FIG. 18C is a sectional view taken along line Y-Y' in FIG. 18A.

FIG. 19A is a plan view illustrating a method for producing a semiconductor device according to an embodiment of the present invention, FIG. 19B is a sectional view taken along line X-X' in FIG. 19A, and FIG. 19C is a sectional view taken along line Y-Y' in FIG. 19A.

FIG. 20A is a plan view illustrating a method for producing a semiconductor device according to an embodiment of the present invention, FIG. 20B is a sectional view taken along line X-X' in FIG. 20A, and FIG. 20C is a sectional view taken along line Y-Y' in FIG. 20A.

FIG. 22A is a plan view illustrating a method for producing a semiconductor device according to an embodiment of the present invention, FIG. 22B is a sectional view taken along line X-X' in FIG. 22A, and FIG. 22C is a sectional view taken along line Y-Y' in FIG. 22A.

FIG. 24A is a plan view illustrating a method for producing a semiconductor device according to an embodiment of the present invention, FIG. 24B is a sectional view taken along line X-X' in FIG. 24A, and FIG. 24C is a sectional view taken along line Y-Y' in FIG. 24A.

FIG. 29A is a plan view illustrating a method for producing a semiconductor device according to an embodiment of the present invention, FIG. 29B is a sectional view taken along line X-X' in FIG. 29A, and FIG. 29C is a sectional view taken along line Y-Y' in FIG. 29A.

FIG. 30A is a plan view illustrating a method for producing a semiconductor device according to an embodiment of the present invention, FIG. 30B is a sectional view taken along line X-X' in FIG. 30A, and FIG. 30C is a sectional view taken along line Y-Y' in FIG. 30A.

FIG. 32A is a plan view illustrating a method for producing a semiconductor device according to an embodiment of the present invention, FIG. 32B is a sectional view taken along line X-X' in FIG. 32A, and FIG. 32C is a sectional view taken along line Y-Y' in FIG. 32A.

FIG. 33A is a plan view illustrating a method for producing a semiconductor device according to an embodiment of the present invention, FIG. 33B is a sectional view taken along line X-X' in FIG. 33A, and FIG. 33C is a sectional view taken along line Y-Y' in FIG. 33A.

FIG. 34A is a plan view illustrating a method for producing a semiconductor device according to an embodiment of the present invention, FIG. 34B is a sectional view taken along line X-X' in FIG. 34A, and FIG. 34C is a sectional view taken along line Y-Y' in FIG. 34A.

FIG. 35A is a plan view illustrating a method for producing a semiconductor device according to an embodiment of the present invention, FIG. 35B is a sectional view taken along line X-X' in FIG. 35A, and FIG. 35C is a sectional view taken along line Y-Y' in FIG. 35A.

FIG. 36A is a plan view illustrating a method for producing a semiconductor device according to an embodiment of the present invention, FIG. 36B is a sectional view taken along line X-X' in FIG. 36A, and FIG. 36C is a sectional view taken along line Y-Y' in FIG. 36A.

FIG. 37A is a plan view illustrating a method for producing a semiconductor device according to an embodiment of the present invention, FIG. 37B is a sectional view taken along line X-X' in FIG. 37A, and FIG. 37C is a sectional view taken along line Y-Y' in FIG. 37A.

FIG. 38A is a plan view illustrating a method for producing a semiconductor device according to an embodiment of the present invention, FIG. 38B is a sectional view taken along line X-X' in FIG. 38A, and FIG. 38C is a sectional view taken along line Y-Y' in FIG. 38A.

FIG. 39A is a plan view illustrating a method for producing a semiconductor device according to an embodiment of the present invention, FIG. 39B is a sectional view taken along line X-X' in FIG. 39A, and FIG. 39C is a sectional view taken along line Y-Y' in FIG. 39A.

FIG. 41A is a plan view illustrating a method for producing a semiconductor device according to an embodiment of the present invention, FIG. 41B is a sectional view taken along line X-X' in FIG. 41A, and FIG. 41C is a sectional view taken along line Y-Y' in FIG. 41A.

FIG. 42A is a plan view illustrating a method for producing a semiconductor device according to an embodiment of the present invention, FIG. 42B is a sectional view taken along line X-X' in FIG. 42A, and FIG. 42C is a sectional view taken along line Y-Y' in FIG. 42A.

FIG. 45A is a plan view illustrating a method for producing a semiconductor device according to an embodiment of the present invention, FIG. 45B is a sectional view taken along line X-X' in FIG. 45A, and FIG. 45C is a sectional view taken along line Y-Y' in FIG. 45A.

FIG. 46A is a plan view illustrating a method for producing a semiconductor device according to an embodiment of the present invention, FIG. 46B is a sectional view taken along line X-X' in FIG. 46A, and FIG. 46C is a sectional view taken along line Y-Y' in FIG. 46A.

DETAILED DESCRIPTION OF THE INVENTION

Figure 5C:
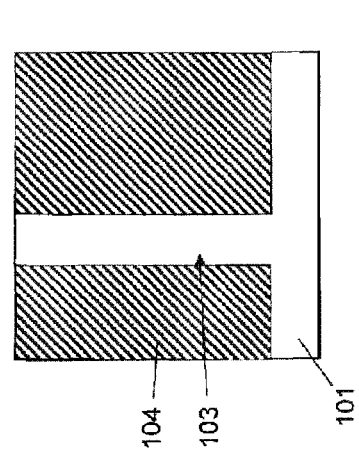
FIG. 5C is a sectional view taken along line Y-Y' in FIG. 5A.

Referring now to the figures of the drawing in detail, a production process for forming an SGT structure according to an embodiment of the present invention will be described with reference to FIG. 2A to FIG. 46C.

Described first is a first step that includes forming a fin-shaped semiconductor layer on a semiconductor substrate and forming a first insulating film around the fin-shaped semiconductor layer. In this embodiment, a silicon substrate is used, but any semiconductor substrate other than the silicon substrate may be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. Herein, the fin-shaped silicon layer has been formed using a resist as a mask, but a hard mask such as an oxide film or a nitride film may be used.

As illustrated in FIGS. 4A to 4C, the first resist 102 is removed.

Figure 5A:
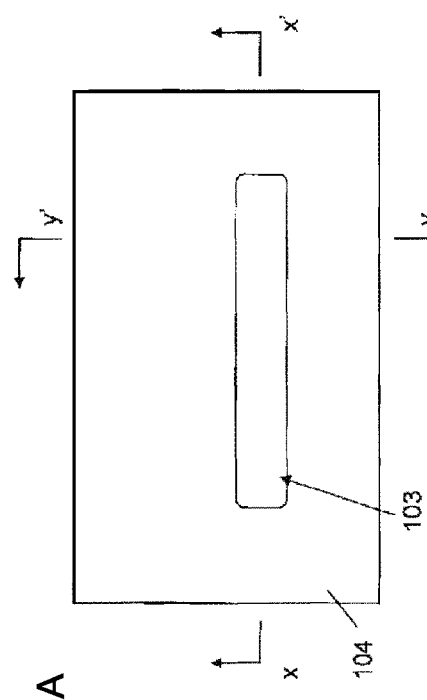
FIG. 5A is a plan view illustrating a method for producing a semiconductor device according to an embodiment of the present invention.
Figure 5B:
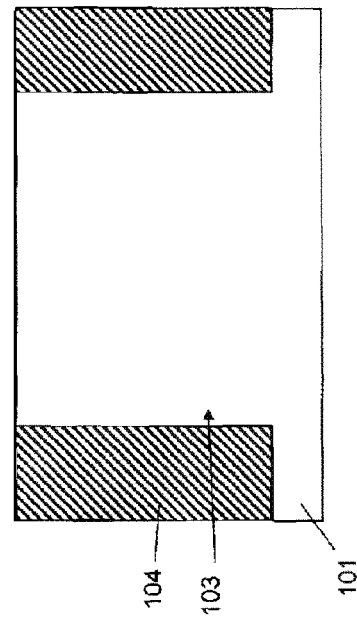
FIG. 5B is a sectional view taken along line X-X' in FIG. 5A.

As illustrated in FIGS. 5A to 5C, a first insulating film 104 is deposited around the fin-shaped silicon layer 103. An oxide film formed by high-density plasma or an oxide film formed by low-pressure chemical vapor deposition (CVD) may be used as the first insulating film.

As illustrated in FIGS. 6A to 6C, the first insulating film 104 is etched back to expose an upper portion of the fin-shaped silicon layer 103. The process so far is the same as that of a method for making a fin-shaped silicon layer in IEDM 2010 CC. Wu, et. al, 27.1.1-27.1.4.

The description so far has shown a first step that includes forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

As illustrated in FIGS. 7A to 7C, a second insulating film 105 is formed around the fin-shaped silicon layer 103. The second insulating film 105 is preferably an oxide film.

Figure 8A:
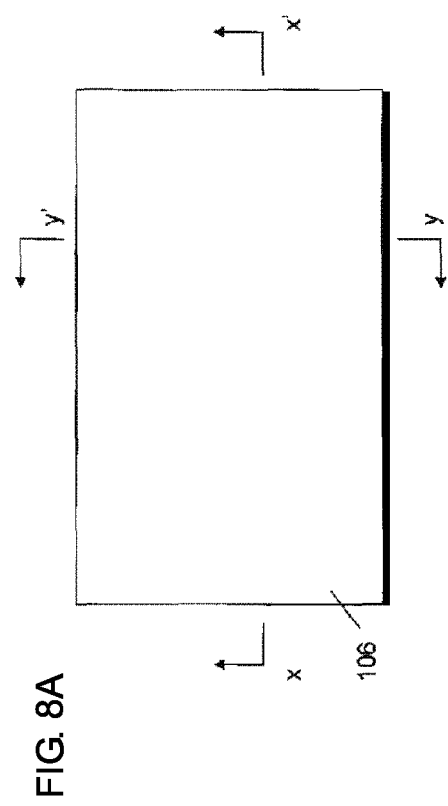
FIG. 8A is a plan view illustrating a method for producing a semiconductor device according to an embodiment of the present invention.
Figure 8C:
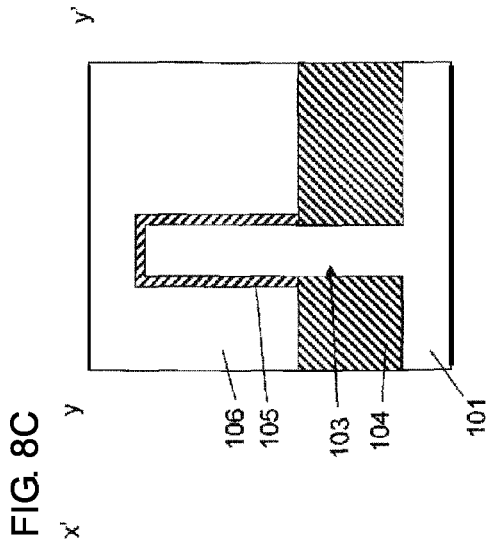
FIG. 8C is a sectional view taken along line Y-Y' in FIG. 8A.
Figure 8B:
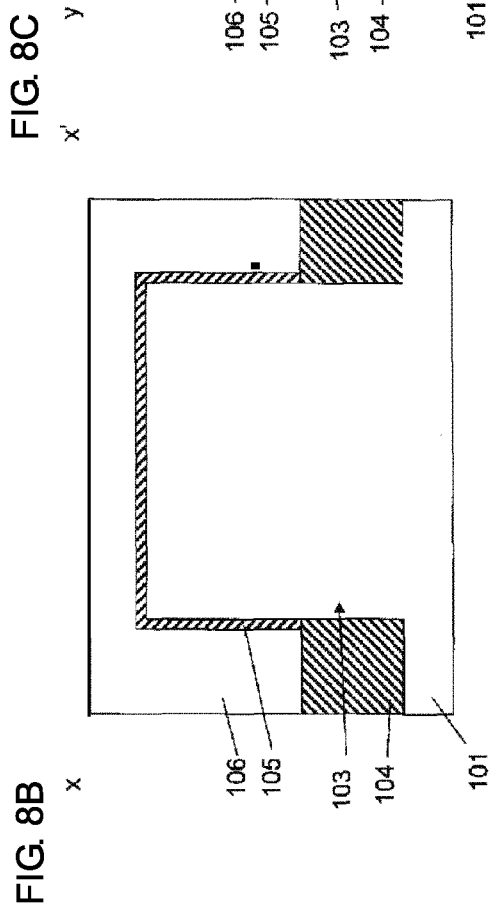
FIG. 8B is a sectional view taken along line X-X' in FIG. 8A.

As illustrated in FIGS. 8A to 8C, a first polysilicon 106 is deposited on the second insulating film 105 and planarized.

Figure 9A:
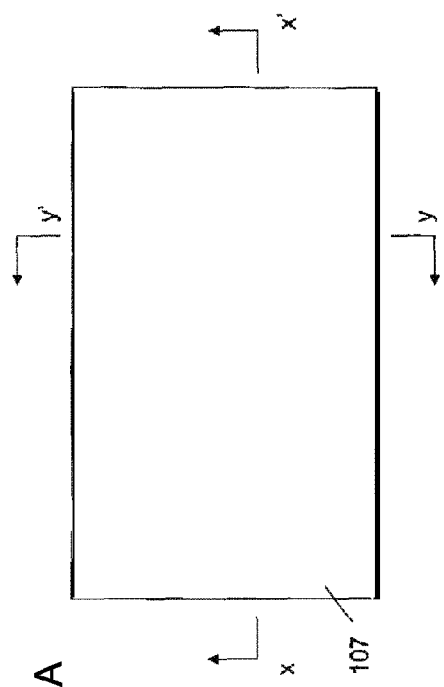
FIG. 9A is a plan view illustrating a method for producing a semiconductor device according to an embodiment of the present invention.
Figure 9C:
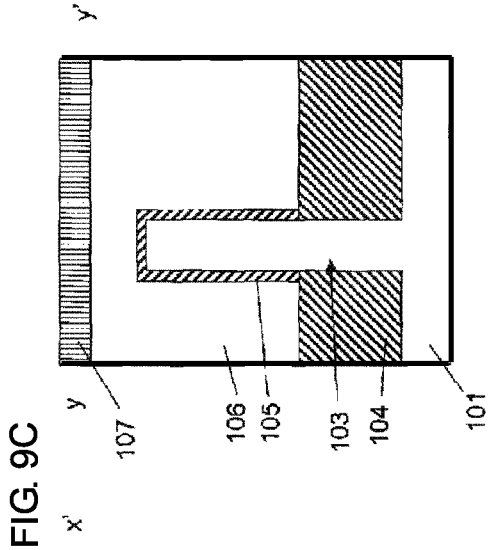
FIG. 9C is a sectional view taken along line Y-Y' in FIG. 9A.
Figure 9B:
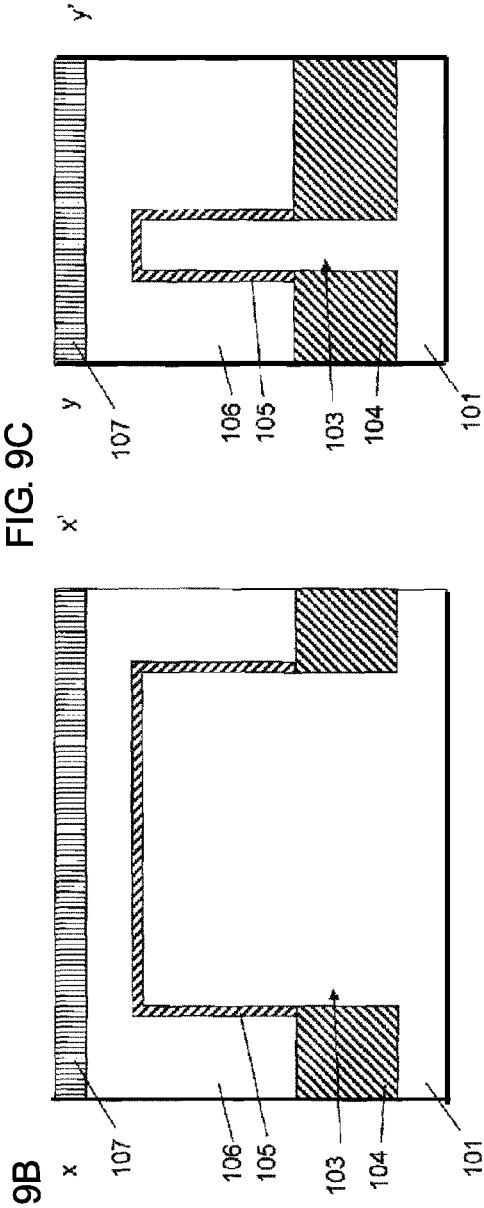
FIG. 9B is a sectional view taken along line X-X' in FIG. 9A.

As illustrated in FIGS. 9A to 9C, a third insulating film 107 is formed on the first polysilicon 106. The third insulating film 107 is preferably a nitride film.

Figure 10A:
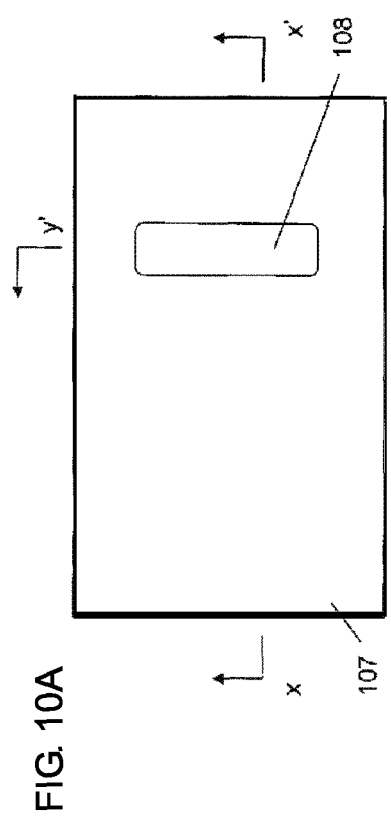
FIG. 10A is a plan view illustrating a method for producing a semiconductor device according to an embodiment of the present invention.
Figure 10B:
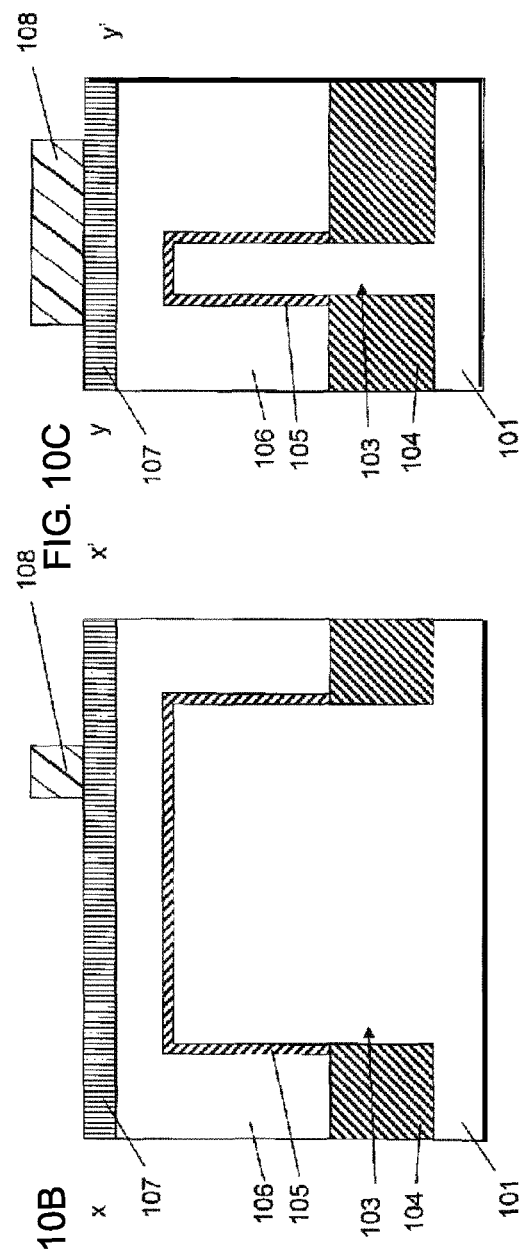
FIG. 10B is a sectional view taken along line X-X' in FIG. 10A.
Figure 10C:
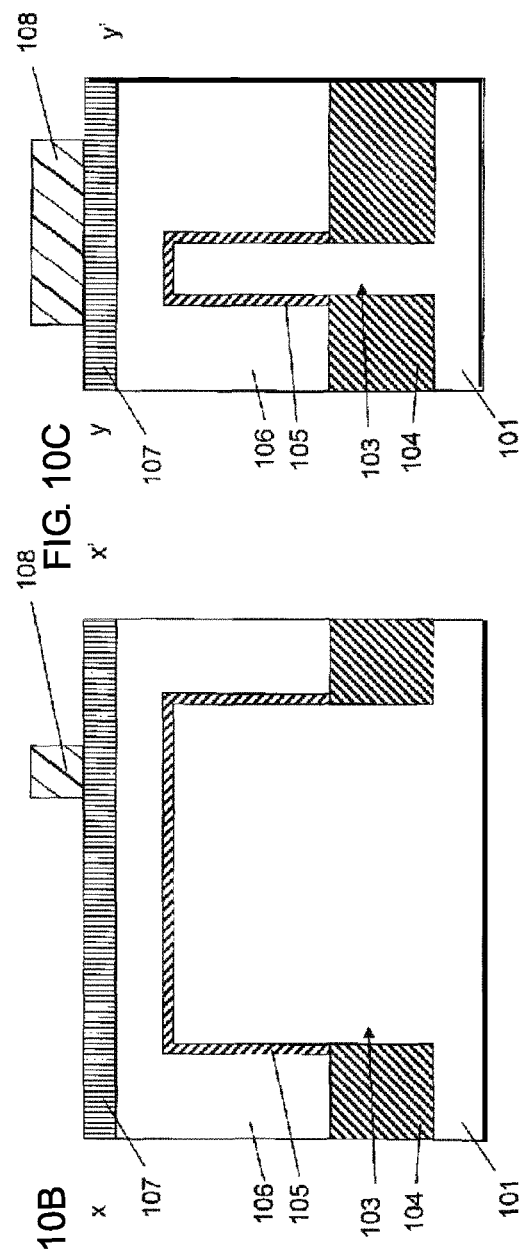
FIG. 10C is a sectional view taken along line Y-Y' in FIG. 10A.

As illustrated in FIGS. 10A to 10C, a second resist 108 for forming a gate line and a pillar-shaped silicon layer is formed in a direction perpendicular to a direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109, a first dummy gate 106a formed of the first polysilicon, and a first hard mask 107a formed of the third insulating film.

As illustrated in FIGS. 12A to 12C, the second resist 108 is removed.

The description so far has shown a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

Described next is a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

As illustrated in FIGS. 13A to 13C, a fourth insulating film 110 is formed around the pillar-shaped silicon layer 109 and the first dummy gate 106a. The fourth insulating film 110 is preferably an oxide film.

Figure 14A:
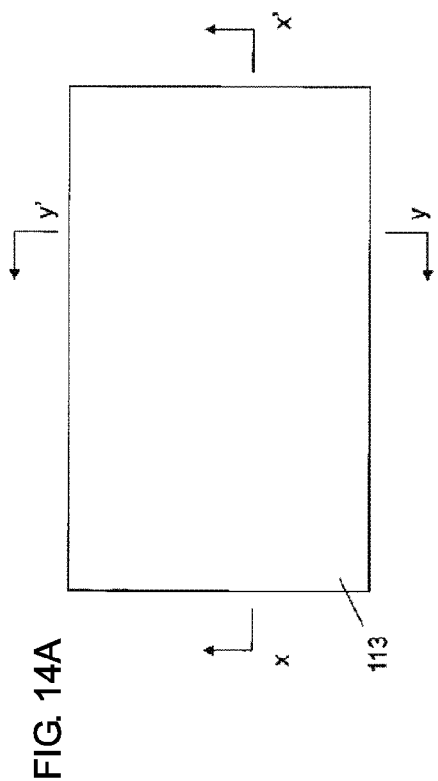
FIG. 14A is a plan view illustrating a method for producing a semiconductor device according to an embodiment of the present invention.
Figure 14C:
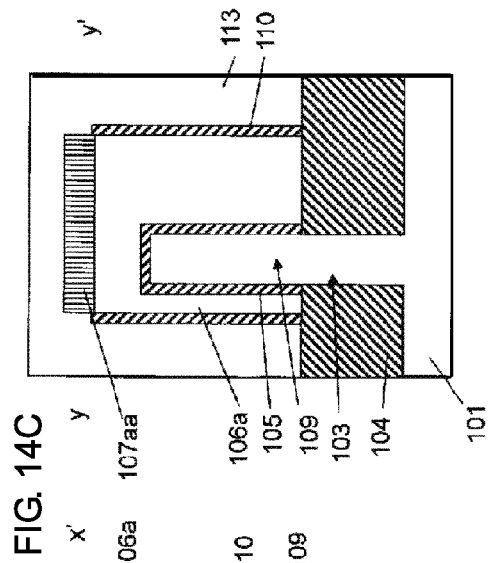
FIG. 14C is a sectional view taken along line Y-Y' in FIG. 14A.
Figure 14B:
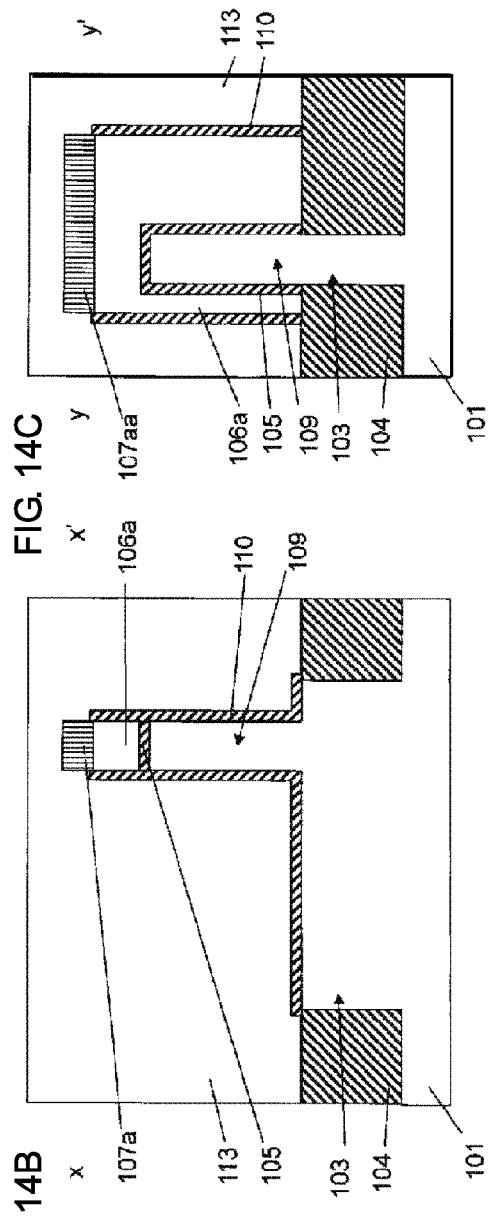
FIG. 14B is a sectional view taken along line X-X' in FIG. 14A.

As illustrated in FIGS. 14A to 14C, a second polysilicon 113 is deposited around the fourth insulating film 110 and planarized.

Figure 15A:
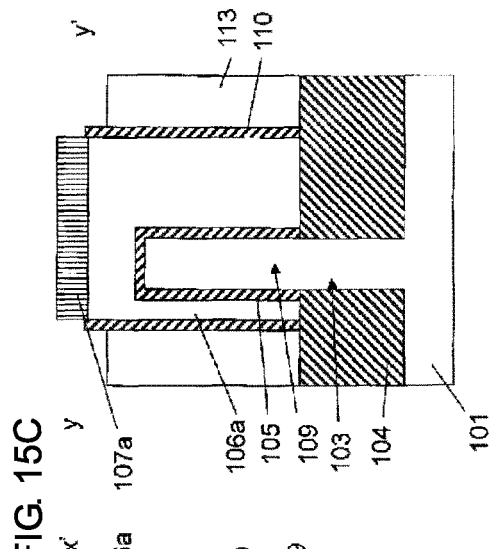
FIG. 15A is a plan view illustrating a method for producing a semiconductor device according to an embodiment of the present invention.
Figure 15B:
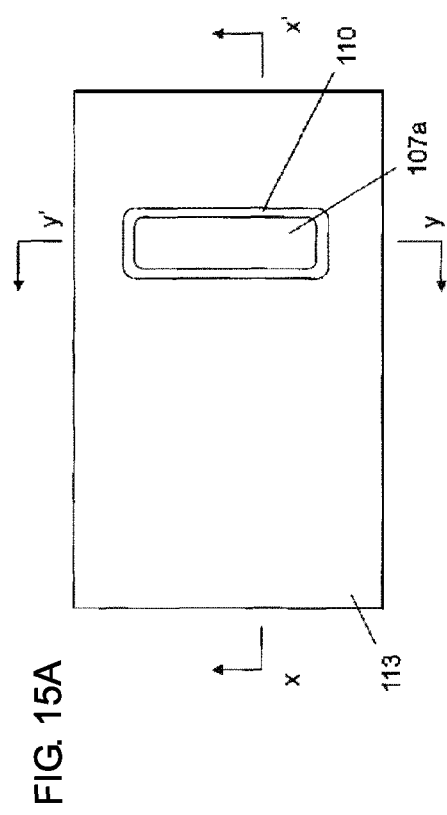
FIG. 15B is a sectional view taken along line X-X' in FIG. 15A.
Figure 15C:
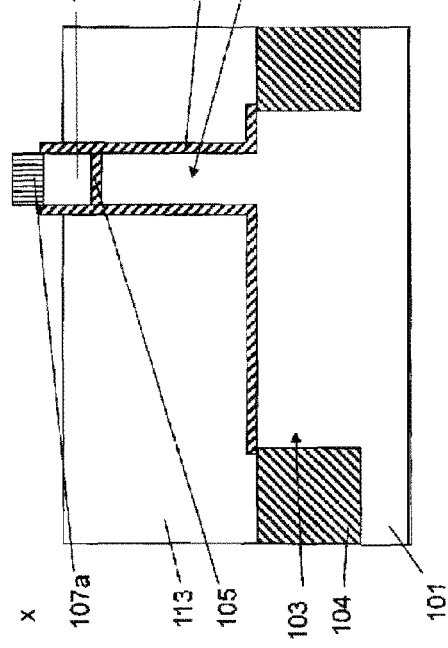
FIG. 15C is a sectional view taken along line Y-Y' in FIG. 15A.

As illustrated in FIGS. 15A to 15C, the second polysilicon 113 is etched back to expose the first hard mask 107a.

As illustrated in FIGS. 16A to 16C, a sixth insulating film 114 is deposited. The sixth insulating film 114 is preferably a nitride film.

As illustrated in FIGS. 17A to 17C, a fourth resist 201 for forming a first dummy contact is formed.

As illustrated in FIGS. 18A to 18C, the sixth insulating film 114 is etched. As a result, a second hard mask 114a is formed on a sidewall of the first hard mask 107a, and a third hard mask 114b for forming the first dummy contact on the fin-shaped silicon layer is formed.

As illustrated in FIGS. 19A to 19C, the second polysilicon 113 is etched so that the second polysilicon 113 is left on sidewalls of the first dummy gate 106a and the pillar-shaped semiconductor layer 109 to form a second dummy gate 113a and form a first dummy contact 113b on the fin-shaped silicon layer 103. The fourth insulating film 110 is divided into fourth insulating films 110a and 110b. When the second polysilicon 113 is etched, by employing reverse-taper etching, the area of an upper surface of the second dummy gate 113a can be made larger than that of a lower surface of the second dummy gate 113a. Thus, in filling with a metal for forming a gate, the formation of holes can be prevented. At the same time, the area of an upper surface of the first dummy contact 113b can be made larger than that of a lower surface of the first dummy contact 113b. Thus, in filling with a metal for a first contact, the formation of holes can be prevented.

As illustrated in FIGS. 20A to 20C, the fourth resist 201 is removed.

The description so far has shown a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

Described next is a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

Figure 21A:
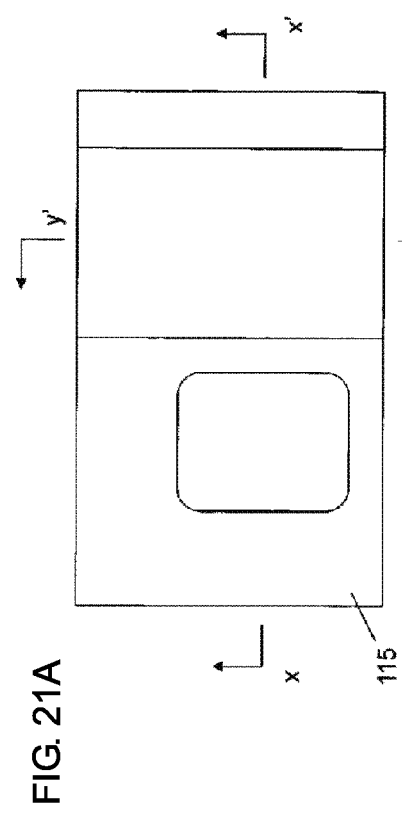
FIG. 21A is a plan view illustrating a method for producing a semiconductor device according to an embodiment of the present invention.
Figure 21C:
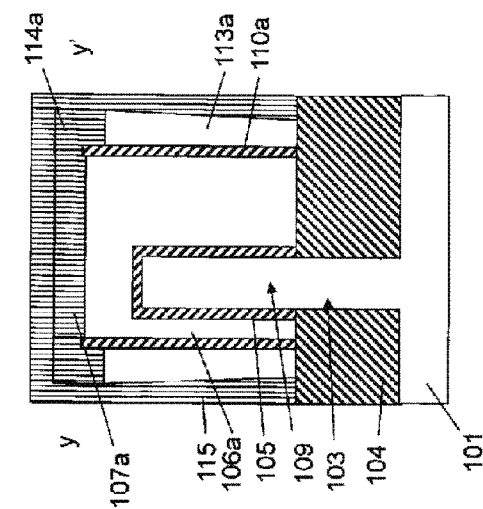
FIG. 21C is a sectional view taken along line Y-Y' in FIG. 21A.
Figure 21B:
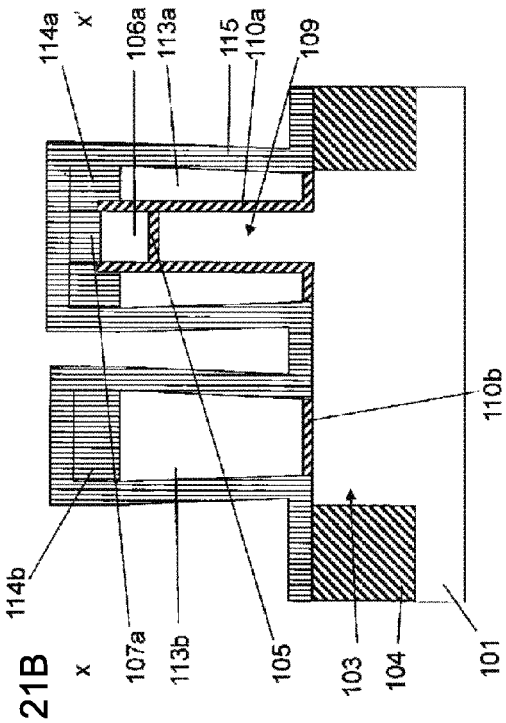
FIG. 21B is a sectional view taken along line X-X' in FIG. 21A.

As illustrated in FIGS. 21A to 21C, a fifth insulating film 115 is formed around the second dummy gate 113a and the first dummy contact 113b. The fifth insulating film 115 is preferably a nitride film.

As illustrated in FIGS. 22A to 22C, the fifth insulating film 115 is etched into a sidewall shape so that sidewalls 115a and 115b formed of the fifth insulating film are formed.

Figure 23C:
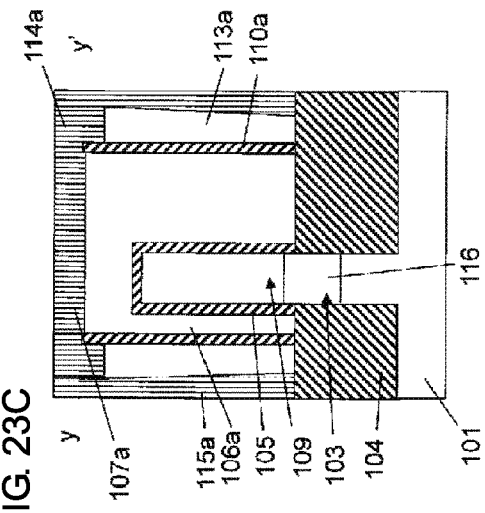
FIG. 23C is a sectional view taken along line Y-Y' in FIG. 23A.
Figure 23A:
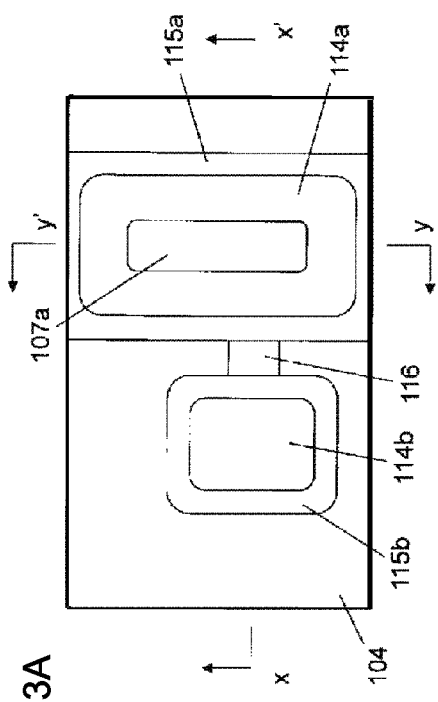
FIG. 23A is a plan view illustrating a method for producing a semiconductor device according to an embodiment of the present invention.
Figure 23B:
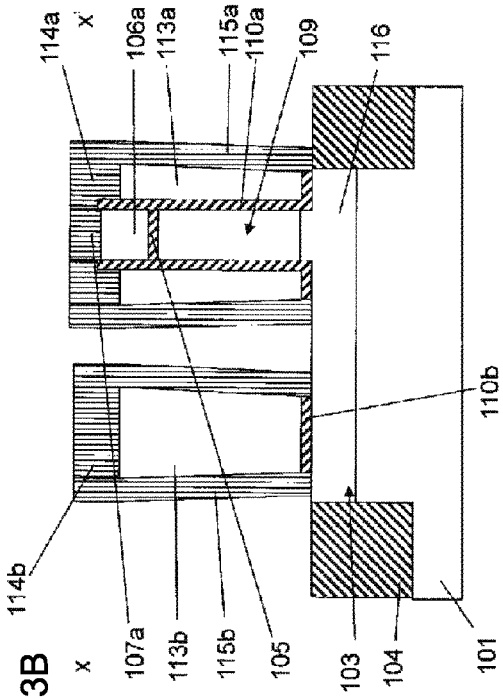
FIG. 23B is a sectional view taken along line X-X' in FIG. 23A.

As illustrated in FIGS. 23A to 23C, an impurity is introduced to form a second diffusion layer 116 in an upper portion of the fin-shaped silicon layer 103 and a lower portion of the pillar-shaped silicon layer 109. When an n-type diffusion layer is formed, arsenic or phosphorus is preferably introduced. When a p-type diffusion layer is formed, boron is preferably introduced. Such an impurity may be introduced before the deposition of the fifth insulating film 115.

As illustrated in FIGS. 24A to 24C, a metal-semiconductor compound 117 is formed in an upper portion of the second diffusion layer 116. Herein, the first and second hard masks 107a and 114a prevent the formation of the metal-semiconductor compound in upper portions of the first and second dummy gates 106a and 113a. As a result, the metal-semiconductor compound can be formed only in an upper portion of the fin-shaped semiconductor layer 103.

The description so far has shown a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

Described next is a fifth step that follows the fourth step and includes depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a first gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the first gate insulating film at a bottom portion of the region where the first dummy contact has been present, removing the first gate insulating film at a bottom portion of the region where the first dummy contact has been present, depositing a first metal, and etching back the first metal to form a gate electrode, a gate line, and a first contact.

Figure 25A:
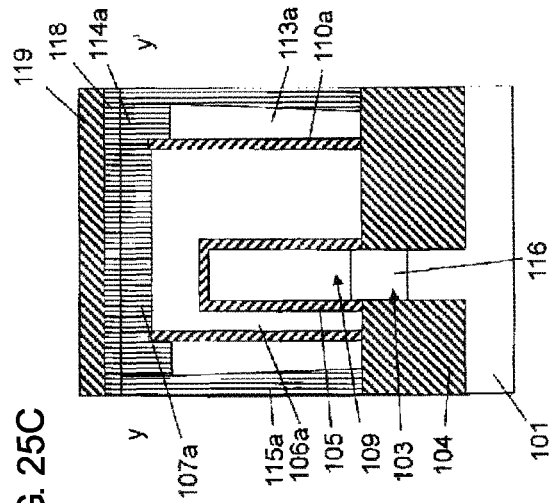
FIG. 25A is a plan view illustrating a method for producing a semiconductor device according to an embodiment of the present invention.
Figure 25B:
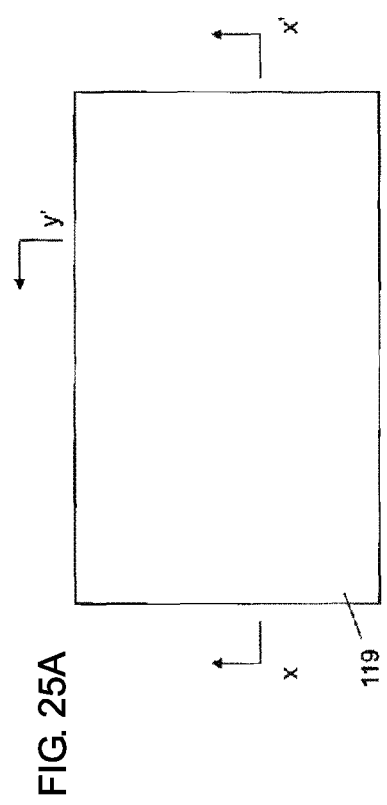
FIG. 25B is a sectional view taken along line X-X' in FIG. 25A.
Figure 25C:
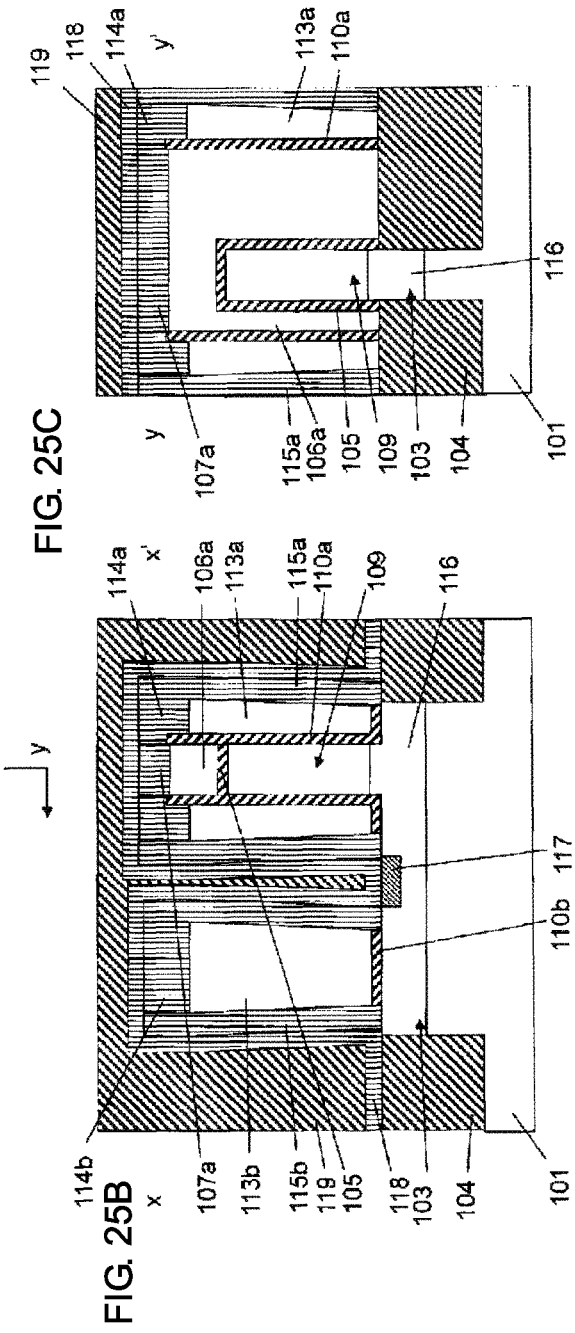
FIG. 25C is a sectional view taken along line Y-Y' in FIG. 25A.

As illustrated in FIGS. 25A to 25C, a contact stopper film 118 is deposited, and an interlayer insulating film 119 is deposited. The contact stopper film 118 is preferably a nitride film. The contact stopper film 118 is not necessarily deposited.

Figure 26A:
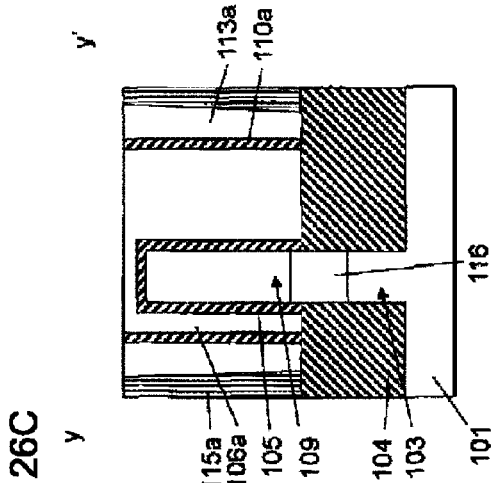
FIG. 26A is a plan view illustrating a method for producing a semiconductor device according to an embodiment of the present invention.
Figure 26B:
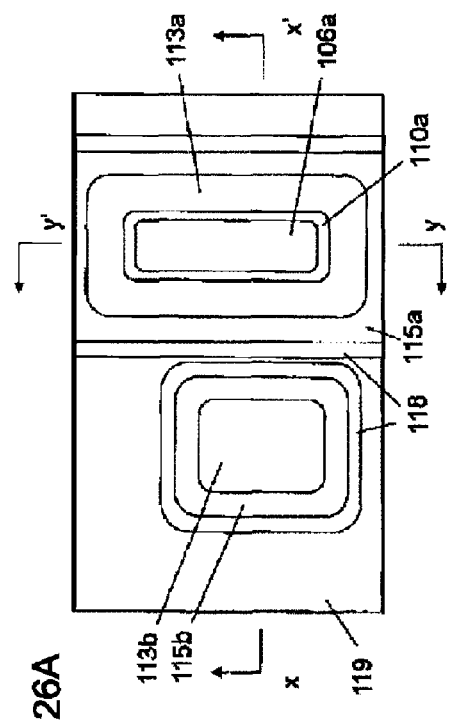
FIG. 26B is a sectional view taken along line X-X' in FIG. 26A.
Figure 26C:
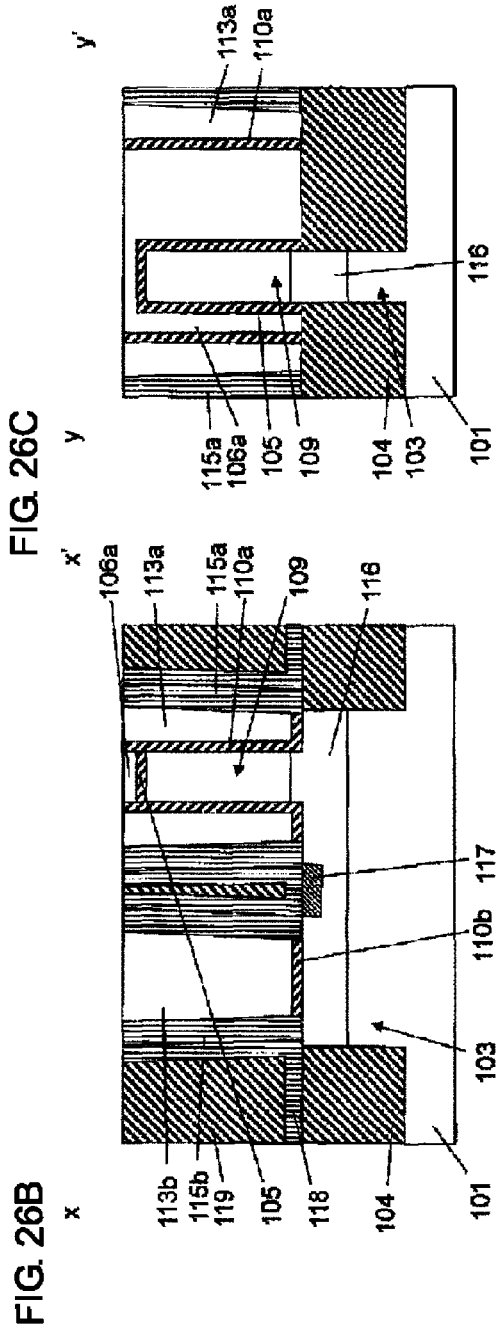
FIG. 26C is a sectional view taken along line Y-Y' in FIG. 26A.

As illustrated in FIGS. 26A to 26C, chemical mechanical polishing is performed to expose upper portions of the second dummy gate 113a, the first dummy gate 106a, and the first dummy contact 113b.

Figure 27A:
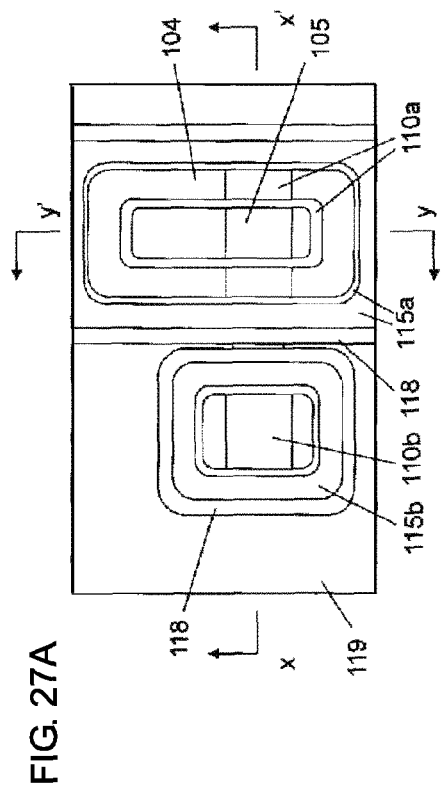
FIG. 27A is a plan view illustrating a method for producing a semiconductor device according to an embodiment of the present invention.
Figure 27C:
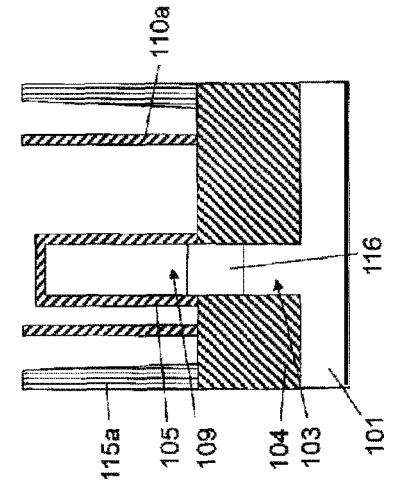
FIG. 27C is a sectional view taken along line Y-Y' in FIG. 27A.
Figure 27B:
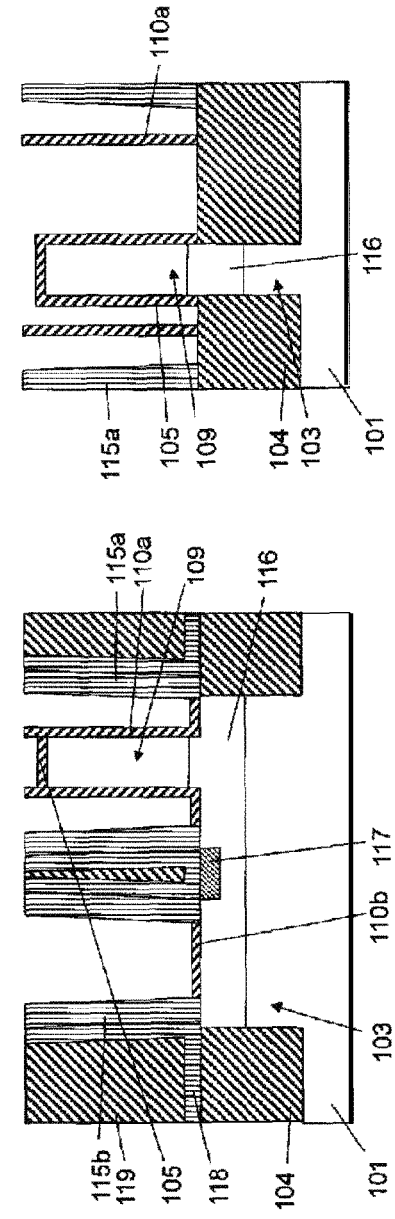
FIG. 27B is a sectional view taken along line X-X' in FIG. 27A.

As illustrated in FIGS. 27A to 27C, the second dummy gate 113a, the first dummy gate 106a, and the first dummy contact 113b are removed.

Figure 28A:
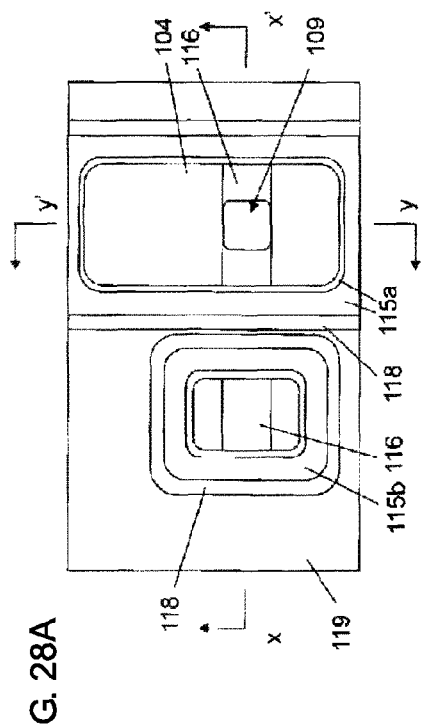
FIG. 28A is a plan view illustrating a method for producing a semiconductor device according to an embodiment of the present invention.
Figure 28C:
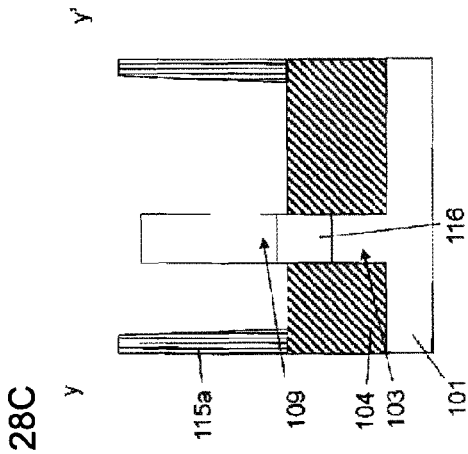
FIG. 28C is a sectional view taken along line Y-Y' in FIG. 28A.
Figure 28B:
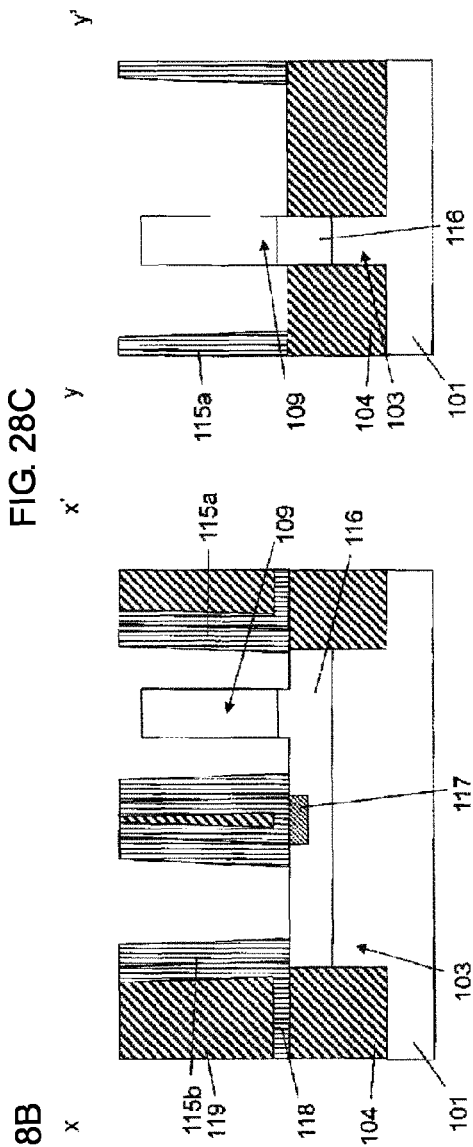
FIG. 28B is a sectional view taken along line X-X' in FIG. 28A.

As illustrated in FIGS. 28A to 28C, the second insulating film 105 and the fourth insulating films 110a and 110b are removed.

As illustrated in FIGS. 29A to 29C, a first gate insulating film 120 is formed around the pillar-shaped silicon layer 109 and on an inner surface of the fifth insulating film 115a in a region where the second dummy gate 113a and the first dummy gate 106a have been present and on an inner surface of the fifth insulating film 115b in a region where the first dummy contact 113b has been present.

As illustrated in FIGS. 30A to 30C, a fifth resist 202 for removing the first gate insulating film 120 at the bottom portion of the region where the first dummy contact 113b has been present is formed.

Figure 31A:
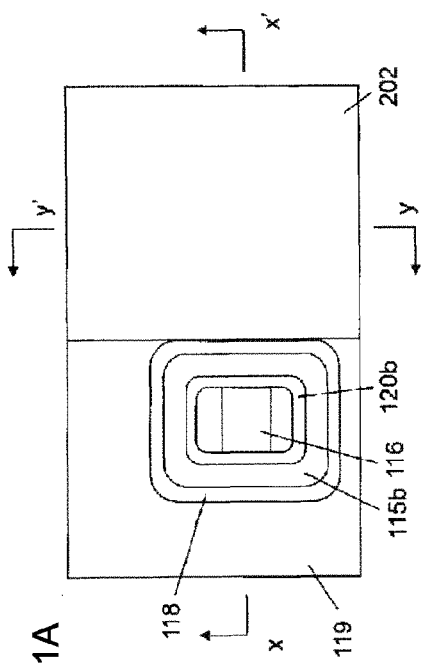
FIG. 31A is a plan view illustrating a method for producing a semiconductor device according to an embodiment of the present invention.
Figure 31C:
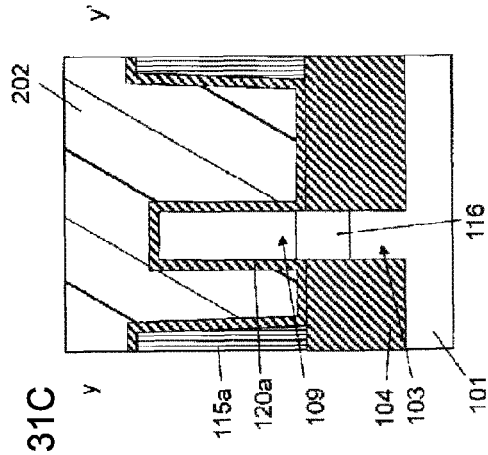
FIG. 31C is a sectional view taken along line Y-Y' in FIG. 31A.
Figure 31B:
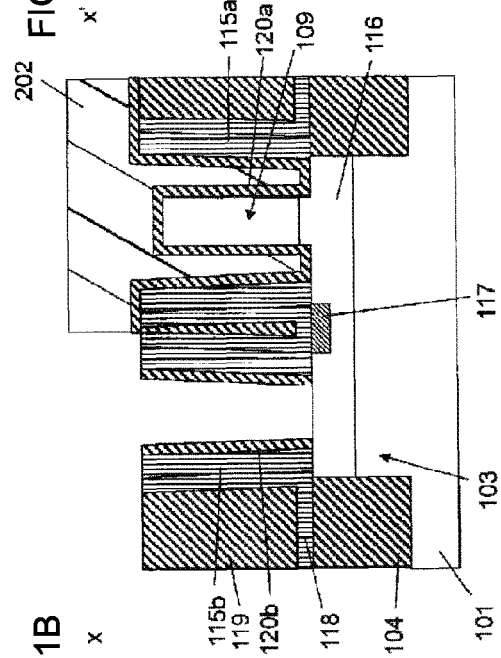
FIG. 31B is a sectional view taken along line X-X' in FIG. 31A.

As illustrated in FIGS. 31A to 31C, the first gate insulating film 120 at the bottom portion of the region where the first dummy contact 113b has been present is removed. The first gate insulating film 120 is divided into first gate insulating films 120a and 120b. When the first gate insulating film 120 is removed by performing anisotropic etching, a first gate insulating film 120b is left on an inner surface of the fifth insulating film 115b in the region where the first dummy contact 113b has been present. The first gate insulating film 120 may be removed by performing isotropic etching. Therefore, etching may be performed by the thickness of the first gate insulating film, and thus a step of forming a deep contact hole is not required.

As illustrated in FIGS. 32A to 32C, the fifth resist 202 is removed.

As illustrated in FIGS. 33A to 33C, a first metal 121 is deposited.

As illustrated in FIGS. 34A to 34C, the first metal 121 is etched back to expose an upper portion of the pillar-shaped silicon layer 109. A gate electrode 121a is formed around the pillar-shaped silicon layer 109. A gate line 121b is also formed. A first contact 121c is also formed. The first gate insulating films 120a and 120b formed around and at the bottom portions of the gate electrode 121a and the gate line 121b can insulate the gate electrode 121a and the gate line 121b from the pillar-shaped silicon layer 109 and the fin-shaped silicon layer 103.

The description so far has shown a fifth step that follows the fourth step and includes depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a first gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the first gate insulating film at a bottom portion of the region where the first dummy contact has been present, removing the first gate insulating film at a bottom portion of the region where the first dummy contact has been present, depositing a first metal, and etching back the first metal to form a gate electrode, a gate line, and a first contact.

Described next is a sixth step that follows the fifth step and includes depositing a second gate insulating film around the pillar-shaped semiconductor layer, on the gate electrode, on the gate line, and on the first contact, removing a portion of the second gate insulating film on the gate line and the second gate insulating film on the first contact, depositing a second metal, etching back the second metal, removing the second gate insulating film on the pillar-shaped semiconductor layer, depositing a third metal, etching portions of the third metal and the second metal to form a second contact in which the second metal surrounds a sidewall of an upper portion of the pillar-shaped semiconductor layer, a third contact formed on the gate line and made of the second metal, and a fourth contact formed on the first contact and made of the second metal, wherein the second contact has an upper portion connected to the upper portion of the pillar-shaped semiconductor layer.

As illustrated in FIGS. 35A to 35C, the exposed first gate insulating films 120a and 120b are removed.

As illustrated in FIGS. 36A to 36C, a second gate insulating film 122 is deposited around the pillar-shaped silicon layer 109, on the gate electrode 121a, on the gate line 121b, and on the first contact 121c.

As illustrated in FIGS. 37A to 37C, a sixth resist 123 for removing a portion of the second gate insulating film 122 on the gate line 121b and the second gate insulating film 122 on the first contact 121c is formed.

As illustrated in FIGS. 38A to 38C, a portion of the second gate insulating film 122 on the gate line 121b and the second gate insulating film 122 on the first contact 121c are removed. The second gate insulating film 122 is divided into second gate insulating films 122a and 122b.

As illustrated in FIGS. 39A to 39C, the sixth resist 123 is removed.

Figure 40A:
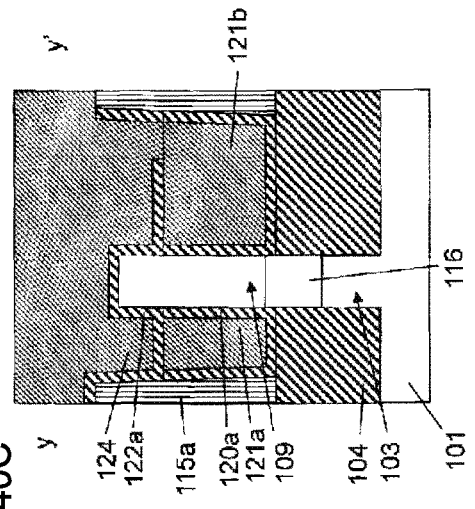
FIG. 40A is a plan view illustrating a method for producing a semiconductor device according to an embodiment of the present invention.
Figure 40B:
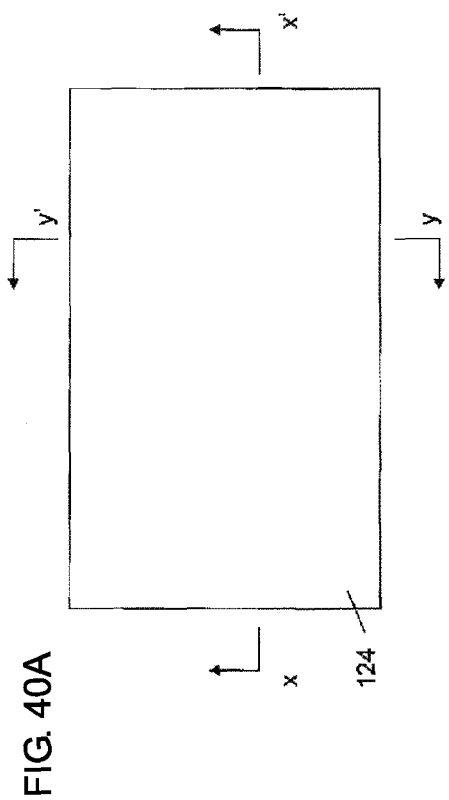
FIG. 40B is a sectional view taken along line X-X' in FIG. 40A.
Figure 40C:
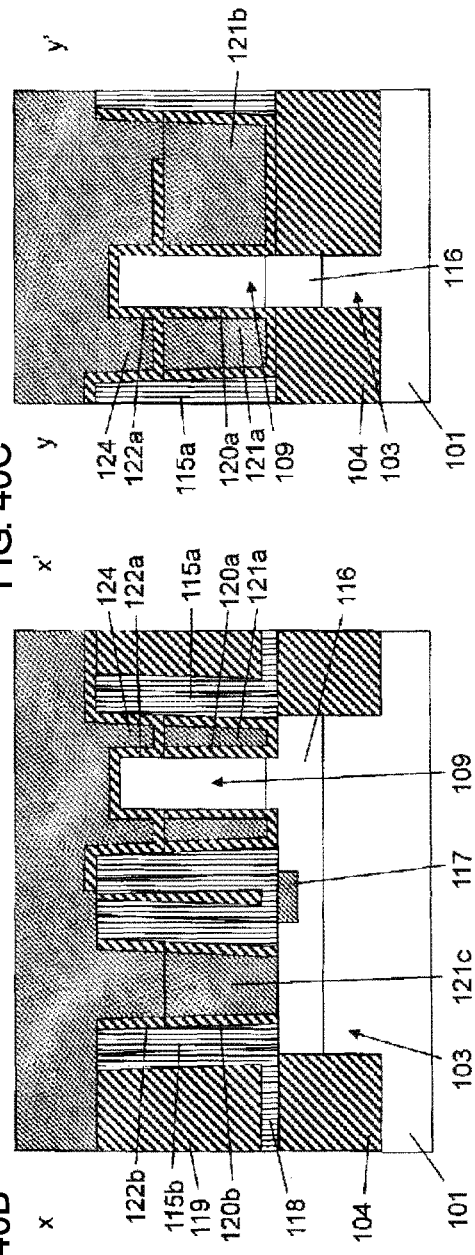
FIG. 40C is a sectional view taken along line Y-Y' in FIG. 40A.

As illustrated in FIGS. 40A to 40C, a second metal 124 is deposited. When the transistor is an n-type transistor, the work function of the second metal 124 is preferably 4.0 eV to 4.2 eV. When the transistor is a p-type transistor, the work function of the second metal 124 is preferably 5.0 eV to 5.2 eV.

As illustrated in FIGS. 41A to 41C, the second metal 124 is etched back to form a second contact line 124a and a fourth contact 124b.

As illustrated in FIGS. 42A to 42C, the second gate insulating film 122a on the exposed pillar-shaped silicon layer 109 is removed.

Figure 43A:
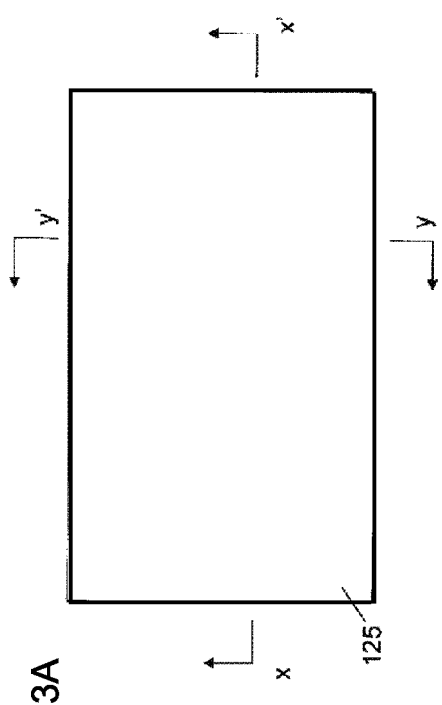
FIG. 43A is a plan view illustrating a method for producing a semiconductor device according to an embodiment of the present invention.
Figure 43C:
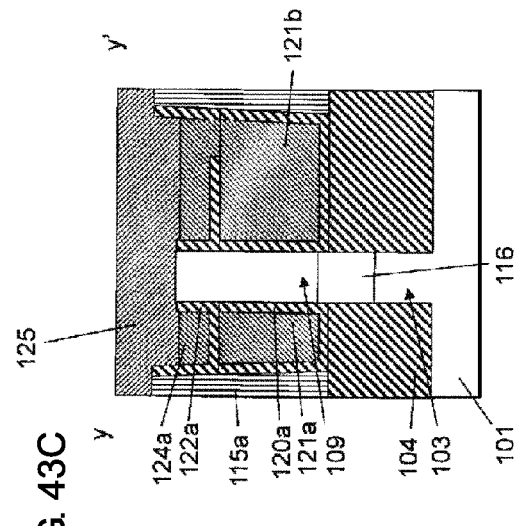
FIG. 43C is a sectional view taken along line Y-Y' in FIG. 43A.
Figure 43B:
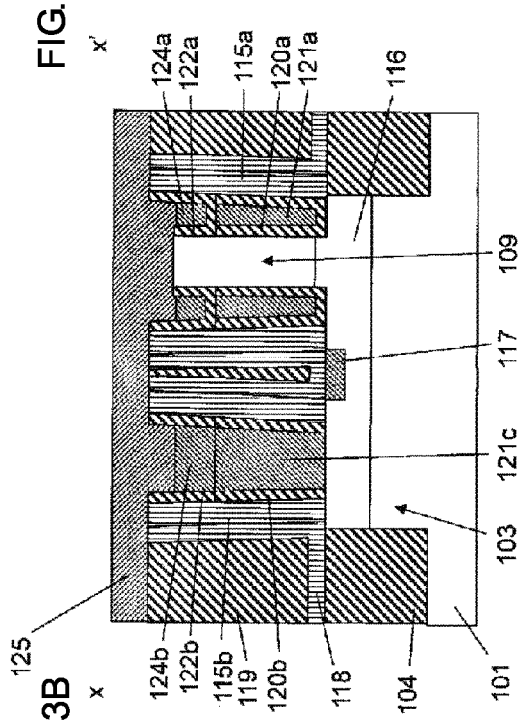
FIG. 43B is a sectional view taken along line X-X' in FIG. 43A.

As illustrated in FIGS. 43A to 43C, a third metal 125 is deposited.

Figure 44A:
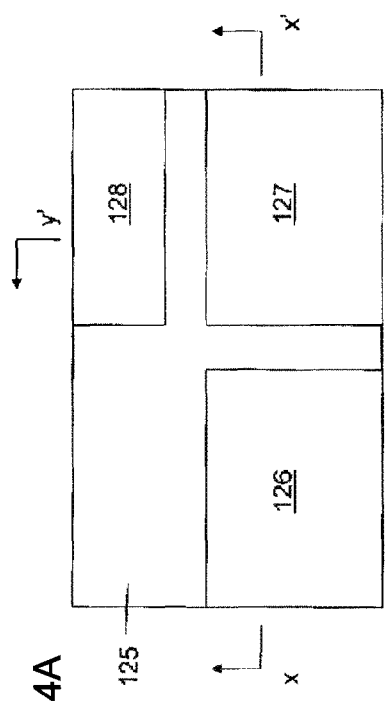
FIG. 44A is a plan view illustrating a method for producing a semiconductor device according to an embodiment of the present invention.
Figure 44C:
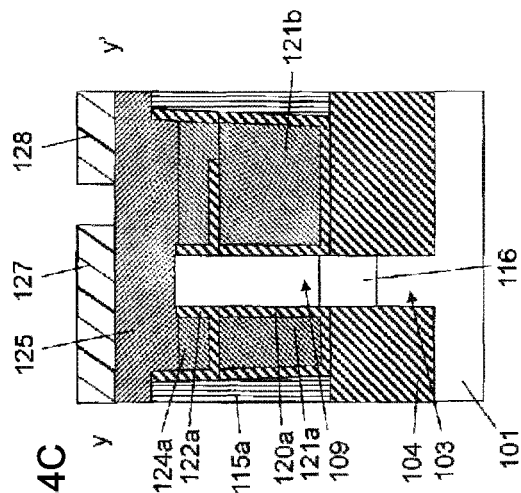
FIG. 44C is a sectional view taken along line Y-Y' in FIG. 44A.
Figure 44B:
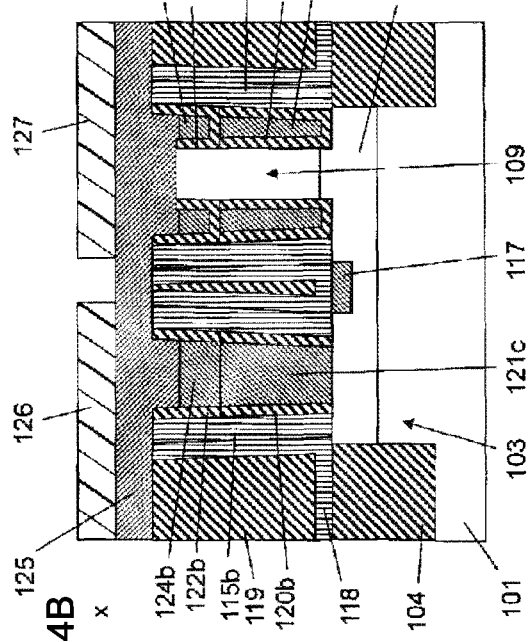
FIG. 44B is a sectional view taken along line X-X' in FIG. 44A.

As illustrated in FIGS. 44A to 44C, seventh resists 126, 127, and 128 are formed.

As illustrated in FIGS. 45A to 45C, the third metal 125 and the second contact line 124a are etched to form a second contact 124c in which the second metal surrounds a sidewall of an upper portion of the pillar-shaped silicon layer 109, a third contact 124d formed on the gate line 121b and made of the second metal, a fourth contact 124b formed on the first contact 121c and made of the second metal, and metal wires 125a, 125b, and 125c. The second contact 124c has an upper portion connected to the upper portion of the pillar-shaped silicon layer 109 through the metal wire 125b.

As illustrated in FIGS. 46A to 46C, the seventh resists 126, 127, and 128 are removed.

The description so far has shown a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed.

FIGS. 1A to 1C illustrate a structure of the semiconductor device obtained by the above production method.

The semiconductor device includes a fin-shaped silicon layer 103 formed on a silicon substrate 101, a first insulating film 104 formed around the fin-shaped silicon layer 103, a first contact 121c formed on the fin-shaped silicon layer 103, a first gate insulating film 120b formed around the first contact 121c, a fourth contact 124b formed on the first contact 121c, and a second gate insulating film 122b formed around the fourth contact 124b. Since the first gate insulating film 120 at the bottom portion of a region where the first dummy contact 113b has been present has been removed, the first gate insulating film 120b remains on an inner surface of the fifth insulating film 115b in the region where the first dummy contact 113b has been present. The first gate insulating film 120 is a highly insulating film formed by atomic layer deposition, and thus can insulate the first contact 121c from the surrounding structure. Furthermore, the second gate insulating film 122b is also a highly insulating film formed by atomic layer deposition, and thus can insulate the fourth contact 124b from the surrounding structure.

The semiconductor device also includes a pillar-shaped silicon layer 109 formed on the fin-shaped silicon layer 103; a first gate insulating film 120a formed around the pillar-shaped silicon layer 109; a gate electrode 121a formed around the first gate insulating film 120a and made of a metal, an upper surface of the gate electrode 121a having a larger area than a lower surface of the gate electrode 121a; a gate line 121b connected the gate electrode 121a, extending in a direction perpendicular to a direction in which the fin-shaped silicon layer 103 extends, and made of a metal, an upper surface of the gate line 121b having a larger area than a lower surface of the gate line 121b; a second diffusion layer 116 formed in an upper portion of the fin-shaped silicon layer 103 and a lower portion of the pillar-shaped silicon layer 109; a second gate insulating film 122a formed around a sidewall of an upper portion of the pillar-shaped silicon layer 109; and a second contact 124c formed around the second gate insulating film 122a and made of a second metal. The second contact 124c has an upper portion connected to the upper portion of the pillar-shaped silicon layer 109.

Misalignment between the pillar-shaped silicon layer 109 and the gate line 121b can be eliminated because they are formed by self-alignment.

The first gate insulating film 120a formed around and at the bottom portions of the gate electrode 121a and the gate line 121b can insulate the gate electrode 121a and the gate line 121b from the pillar-shaped silicon layer 109 and the fin-shaped silicon layer 103.

A third contact 124d made of the second metal is formed on the gate line 121b. Therefore, the upper surface of the second contact, the upper surface of the third contact, and the upper surface of the fourth contact have the same height. Consequently, the formation of a deep contact hole is not required.

It should be noted that various other embodiments and modifications can be made without departing from the broad spirit and scope of the present invention, and the above-described embodiments are merely for illustrative purpose only and do not limit the scope of the present invention.

For example, in the above-described embodiments, a method for producing a semiconductor device in which the p-type (including the $p^+$-type) and the n-type (including the $n^+$-type) are each changed to the opposite conductivity type and a semiconductor device produced by the method are naturally within the technical scope of the present invention.

The invention claimed is:

1. A semiconductor device, comprising:
a fin-shaped semiconductor layer on a semiconductor substrate;
a first insulating film around the fin-shaped semiconductor layer;
a first contact on the fin-shaped semiconductor layer, wherein an upper surface of the first contact has a larger area than a lower surface of the first contact;
a first gate insulating film around the first contact;
a fourth contact on the first contact; and
a second gate insulating film around the fourth contact.

2. The semiconductor device according to claim 1, further comprising:
a pillar-shaped semiconductor layer on the fin-shaped semiconductor layer;
the first gate insulating film around the pillar-shaped semiconductor layer;
a gate electrode around the first gate insulating film and made of a first metal;
a gate line connected to the gate electrode, extending in a direction perpendicular to a direction in which the fin-shaped semiconductor layer extends, and made of the first metal;

a second diffusion layer in an upper portion of the fin-shaped semiconductor layer and a lower portion of the pillar-shaped semiconductor layer;

a second gate insulating film around a sidewall of an upper portion of the pillar-shaped semiconductor layer; and a second contact around the second gate insulating film and made of a second metal, wherein the second contact has an upper portion connected to the upper portion of the pillar-shaped semiconductor layer, an upper surface of the gate electrode and the gate line has a larger area than a lower surface of the gate electrode and the gate line.

3. The semiconductor device according to claim 2, wherein the first gate insulating film is also around and at bottom portions of the gate electrode and the gate line.

4. The semiconductor device according to claim 2, further comprising a third contact on the gate line and made of the second metal.

5. The semiconductor device according to claim 2, wherein the second metal for the second contact has a work function of 4.0 eV to 4.2 eV.

6. The semiconductor device according to claim 2, wherein the second metal for the second contact has a work function of 5.0 eV to 5.2 eV.

* * * * *